United States Patent
Yata

(10) Patent No.: US 7,479,855 B2
(45) Date of Patent: Jan. 20, 2009

(54) LONGITUDINALLY-COUPLED-RESONATOR-TYPE ELASTIC WAVE FILTER DEVICE

(75) Inventor: Masaru Yata, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/174,734

(22) Filed: Jul. 17, 2008

(65) Prior Publication Data

US 2008/0266027 A1    Oct. 30, 2008

Related U.S. Application Data

(63) Continuation of application No. PCT/JP2007/066168, filed on Aug. 21, 2007.

(30) Foreign Application Priority Data

Sep. 22, 2006  (JP) .............................. 2006-257088

(51) Int. Cl.
  *H03H 9/145* (2006.01)
  *H03H 9/64* (2006.01)
(52) U.S. Cl. ................. 333/196; 333/195; 333/193; 310/313 B
(58) Field of Classification Search ......... 333/193–196; 310/313 B
See application file for complete search history.

(56) References Cited

U.S. PATENT DOCUMENTS 6,815,868 B2    11/2004    Shibata et al.
6,853,270 B2 *  2/2005    Shibahara ................. 333/195
2004/0080385 A1 *  4/2004    Takamine et al. ............ 333/195
2006/0181369 A1 *  8/2006    Shibahara ................. 333/195

FOREIGN PATENT DOCUMENTS

| JP | 61-029531 U | | 2/1986 |
| JP | 03-132208 A | | 6/1991 |
| JP | 06-350383 | * | 12/1994 |
| JP | 2006-080873 A | | 3/2006 |
| JP | 2006-254410 A | | 9/2006 |
| WO | 2006/109591 A1 | | 10/2006 |

OTHER PUBLICATIONS

Official Communication issued in International Patent Application No. PCT/JP2007/066168, mailed on Nov. 20, 2007.

* cited by examiner

*Primary Examiner*—Barbara Summons
(74) *Attorney, Agent, or Firm*—Keating & Bennett, LLP

(57) ABSTRACT

In a longitudinally-coupled-resonator-type elastic wave filter device, at least one of two IDTs which are adjacent to each other is provided with a dummy electrode for series weighting in a portion in which the IDTs are adjacent to each other, and at least one of series-weighted portions includes at least one of metallization ratio reducing portion in a first acoustic track and metallization ratio increasing portion in a second acoustic track so as to reduce the difference between the metallization ratio of the first acoustic track passing through a connecting portion of the dummy electrode and the metallization ratio of each of second and third acoustic tracks each placed on either side of the first acoustic track in the direction of propagation of an elastic wave.

11 Claims, 14 Drawing Sheets

LONGITUDINALLY-COUPLED-RESONATOR-TYPE ELASTIC WAVE FILTER DEVICE

BACKGROUND OF THE INVENTION

1. Field of the Invention

The present invention relates to elastic wave filter devices that are used as, for example, band-pass filters for mobile telephones or other suitable uses, and, more particularly, to a longitudinally-coupled-resonator-type elastic wave filter device.

2. Description of the Related Art

Various surface acoustic wave filter devices have been used as band-pass filters for mobile telephones. For example, Japanese Patent No. 3520420 discloses a surface acoustic wave filter device used as a band-pass filter for a mobile telephone, and having a balanced-to-unbalanced conversion function. The balance between a pair of balanced terminals is improved by using an IDT 1001 illustrated in FIG. 19.

The IDT 1001 is disposed on a piezoelectric substrate 1000. The IDT 1001 includes electrode fingers 1002 and 1003 near one end thereof in a direction in which a surface acoustic wave propagates. The electrode fingers 1002 and 1003 are apodization-weighted electrode fingers. The electrode fingers 1002 and 1003 are connected to a ground potential and a hot-side potential, respectively. The length of the electrode fingers 1002 and 1003 is less than that of the other electrode fingers 1004 connected to the ground potential and the other hot-side electrode fingers 1005.

On the other hand, in a portion in which the electrode fingers 1002 and 1003 are provided, a dummy electrode 1006 is disposed for series weighting. The dummy electrode 1006 has a first dummy electrode finger portion 1006a, a second dummy electrode finger portion 1006b, and a connecting portion 1006c connecting the first dummy electrode finger portion 1006a and the second dummy electrode finger portion 1006b.

The first dummy electrode finger portion 1006a is disposed along the extension line of the longitudinal axis of the electrode finger 1002 with a gap between it and the forward end of the electrode finger 1002 so that it overlaps with the electrode finger 1003 in the direction of propagation of a surface acoustic wave. The second dummy electrode finger portion 1006b is similarly disposed along the extension line of the longitudinal axis of the electrode finger 1003 with a gap between it and the forward end of the electrode finger 1003 so that it overlaps, that is, interdigitates with the electrode finger 1002 in the direction of propagation of a surface acoustic wave. The connecting portion 1006c extends in a region between the forward ends of the electrode fingers 1002 and 1003 in the direction of propagation of a surface acoustic wave, and connects the inner ends of the first dummy electrode finger portion 1006a and the second dummy electrode finger portion 1006b.

In a portion in which the dummy electrode 1006 is disposed, excitation of a surface acoustic wave is weakened by the dummy electrode 1006. By disposing the dummy electrode 1006 in an IDT connected to one of a pair of balanced terminals at which a surface acoustic wave is excited at a higher level than that of excitation of a surface acoustic wave at the other one of the balanced terminals, the surface acoustic wave excitation levels at the balanced terminals are relatively close to each other. Consequently, the balance between the balanced terminals is improved.

As described previously, by performing series weighting on an IDT in a longitudinally-coupled-resonator-type surface acoustic wave filter device having the balanced-to-unbalanced conversion function, the balance between the balanced terminals can be improved.

However, if such a series-weighed IDT is used in a longitudinally-coupled-resonator-type surface acoustic wave filter device, a high level of ripple is generated in a pass band.

SUMMARY OF THE INVENTION

To overcome the problems described above, preferred embodiments of the present invention provide a longitudinally-coupled-resonator-type elastic wave filter device that includes a series-weighted IDT and achieves outstanding filter characteristics by effectively suppressing the generation of ripples in a pass band.

According to a preferred embodiment of the present invention, a longitudinally-coupled-resonator-type elastic wave filter device is provided which includes a piezoelectric substrate and at least two IDTs disposed on the piezoelectric substrate along a direction of propagation of an elastic wave. At least one of the IDTs includes, in a portion in which the IDTs are adjacent to each other, a first electrode finger that is an outermost electrode finger nearest to the other one of the IDTs, a second electrode finger adjacent to the first electrode finger, and a dummy electrode disposed between the first electrode finger and the second electrode finger. The dummy electrode includes a first dummy electrode finger portion, a second dummy electrode finger portion, and a connecting portion connecting the first dummy electrode finger portion and the second dummy electrode finger portion. The first dummy electrode finger portion is disposed along an extension line of a longitudinal axis of the first electrode finger with a gap between the first dummy electrode finger portion and a forward end of the first electrode finger and extends substantially in parallel to the second electrode finger. The second dummy electrode finger portion is disposed along an extension line of a longitudinal axis of the second electrode finger with a gap between the second dummy electrode finger portion and a forward end of the second electrode finger and extends substantially parallel to the first electrode finger. The connecting portion is disposed between the forward end of the first electrode finger and the forward end of the second electrode finger. Apodization weighting is performed by making a length of the first electrode finger and the second electrode finger different from a length of the other electrode fingers. Series weighting is performed by providing the dummy electrode. An elastic wave propagation portion in the longitudinally-coupled-resonator-type surface acoustic wave filter device includes a first acoustic track, second acoustic tracks disposed on both sides of the first acoustic track in a direction substantially perpendicular to the direction of propagation of an elastic wave, and a third acoustic track disposed outside each second acoustic track in the direction substantially perpendicular to the direction of propagation of an elastic wave. The first acoustic track passes through the connecting portion of the dummy electrode. The second acoustic track includes a gap between the forward end of the first electrode finger and the connecting portion of the dummy electrode and a gap between the forward end of the second electrode finger and the connecting portion of the dummy electrode. The third acoustic track includes the first electrode finger and the second electrode finger. The series-weighted portion includes at least one of a metallization ratio increasing portion arranged to increase a metallization ratio of the second acoustic track and a metallization ratio reducing portion arranged to reduce a metallization ratio of the first acoustic track so as to reduce a difference between the metallization ratio of the first acoustic track and the metallization ratio of the second acoustic track.

Preferably, the metallization ratio increasing portion is defined by at least one protrusion in the second acoustic track. The at least one protrusion includes at least one of a protrusion protruding from the first dummy electrode finger portion toward the second electrode finger adjacent to the first dummy electrode finger portion, a protrusion protruding from the second dummy electrode finger portion toward the first electrode finger adjacent to the second dummy electrode finger portion, a protrusion protruding from an electrode finger adjacent to the second electrode finger on an inner side of the second electrode finger toward the second electrode finger, a protrusion protruding from the forward end of the first electrode finger toward the second acoustic track, and a protrusion protruding from the forward end of the second electrode finger toward the second acoustic track. Thus, where a protrusion is used as the metallization ratio increasing portion, by simply changing a pattern when forming the dummy electrode or the electrode finger by patterning, the metallization ratio increasing portion can be easily formed. Accordingly, the metallization ratio increasing portion can be formed so as to improve a filter characteristic without increasing the number of manufacturing processes.

Preferably, the metallization ratio reducing portion is an electrode cutout portion that is provided in the connecting portion so as to reduce an area of the connecting portion of the dummy electrode in the first acoustic track. Where the metallization ratio reducing portion is an electrode cutout portion that is provided in the connecting portion so as to reduce an area of the connecting portion of the dummy electrode in the first acoustic track, by simply changing a pattern when forming an electrode by patterning, the metallization ratio of the first acoustic track can be reduced. Accordingly, a filter characteristic can be improved without increasing the number of manufacturing processes.

Each of the IDTs is preferably made of a metal film including a metal layer made of a material selected from the group consisting of Au, Pt, Pd, Ag, Cu, W, and an alloy primarily including of one of Au, Pt, Pd, Ag, Cu, and W. In this case, an elastic wave acoustic velocity is significantly decreased, since each of the IDTs includes the above-described relatively heavy metal layer. Accordingly, the reduction of the difference between the metallization ratios of the first acoustic track and the second acoustic track is highly effective.

A longitudinally-coupled-resonator-type elastic wave filter device preferably includes an unbalanced terminal, a first balanced terminal, and a second balanced terminal so as to have a balanced-to-unbalanced conversion function. Accordingly, a filter device is provided which requires no balun but which includes the balanced-to-unbalanced conversion function.

A configuration required for providing the balanced-to-unbalanced conversion function is not particularly limited. In a preferred embodiment of the present invention, however, the at least two IDTs on the piezoelectric substrate each include a first filter element and a second filter element. The first filter element is a longitudinally-coupled-resonator-type elastic wave filter element including a plurality of IDTs disposed along a direction of propagation of an elastic wave, an input terminal, and an output terminal. The second filter element is a longitudinally-coupled-resonator-type filter element including a plurality of IDTs disposed along a direction of propagation of an elastic wave, an input terminal, and an output terminal. An output signal relative to an input signal in the second filter element is about 180° out of phase with an output signal relative to an input signal in the first filter element. The input terminals of the first filter element and the second filter element are connected to the unbalanced terminal. The output terminal of the first filter element is connected to the first balanced terminal. The output terminal of the second filter element is connected to the second balanced terminal.

In another preferred embodiment of an elastic wave filter device according to the present invention, a configuration providing the balanced-to-unbalanced conversion function is as follows. The first filter element includes a first longitudinally-coupled-resonator-type elastic wave filter portion and a second longitudinally-coupled-resonator-type elastic wave filter portion each including a plurality of IDTs disposed along a direction of propagation of an elastic wave. The first and second longitudinally-coupled-resonator-type elastic wave filter portions are cascade-connected. The second filter element includes a third longitudinally-coupled-resonator-type elastic wave filter portion and a fourth longitudinally-coupled-resonator-type elastic wave filter portion each including a plurality of IDTs disposed along a direction of propagation of an elastic wave. The third and fourth longitudinally-coupled-resonator-type elastic wave filter portions are cascade-connected.

Alternatively the configuration providing the balanced-to-unbalanced conversion function may be as follows. The longitudinally-coupled-resonator-type elastic wave filter device includes, as the at least two IDTs disposed on the piezoelectric substrate, a fourth IDT, a second IDT, a first IDT, a third IDT, and a fifth IDT disposed in this order along a direction of propagation of an elastic wave, and further includes a first reflector disposed one side of a portion in which the first to fifth IDTs are disposed and a second reflector disposed on the other side of the portion in which the first to fifth IDTs are disposed. The second IDT is about 180° out of phase with the third IDT. The second and third IDTs are connected to the unbalanced terminal. The first IDT includes a first sub-IDT portion and a second sub-IDT portion which are obtained by dividing the first IDT in the direction of propagation of an elastic wave. The first sub-IDT portion and the fourth IDT are connected to the first balanced terminal. The second sub-IDT portion and the fifth IDT are connected to the second balanced terminal. The configuration providing the balanced-to-unbalanced conversion function may be as follows. The longitudinally-coupled-resonator-type elastic wave filter device includes, as the at least two IDTs formed on the piezoelectric substrate, the fourth IDT, the second IDT, the first IDT, the third IDT, and the fifth IDT disposed in this order along a direction of propagation of an elastic wave, and further includes the first reflector disposed one side of the portion in which the first to fifth IDTs are disposed and the second reflector disposed on the other side of the portion in which the first to fifth IDTs are disposed. The second IDT is about 180° out of phase with the third IDT. One end of each of the first, fourth, and fifth IDTs is connected to the unbalanced terminal. The second IDT is connected to the first balanced terminal. The third IDT is connected to the second balanced terminal.

A longitudinally-coupled-resonator-type elastic wave filter device according to preferred embodiments of the present invention may use a surface acoustic wave as the elastic wave. In this case, according to preferred embodiments of the present invention, a surface acoustic wave filter device having outstanding filter characteristics is obtained.

In preferred embodiments of the present invention, a boundary acoustic wave may be used as the elastic wave. In this case, a dielectric layer is disposed on the piezoelectric substrate. According to preferred embodiments of the present invention, a longitudinally-coupled-resonator-type boundary acoustic wave filter device having outstanding filter characteristics is obtained.

In a longitudinally-coupled-resonator-type elastic wave filter device according to preferred embodiments of the present invention, in a portion in which a first IDT and a second IDT are adjacent to each other and/or a portion in which the first IDT and a third IDT are adjacent to each other, at least one of the adjacent two IDTs is series-weighted. The series-weighted portion is provided with at least one of the metallization ratio increasing portion and the metallization ratio reducing portion so as to reduce the difference between the metallization ratios of the first acoustic track and the second acoustic track. Accordingly, the generation of ripples in the pass band can be effectively suppressed.

As will be described later, the inventor discovered that the generation of ripples in a pass band in a series-weighted longitudinally-coupled-resonator-type boundary acoustic wave filter device in the related art was caused by the discontinuity in the acoustic velocity of an elastic wave between adjacent acoustic tracks due to a large difference between metallization ratios of the adjacent acoustic tracks.

According to preferred embodiments of the present invention, as described previously, since the difference between the metallization ratios of the first and second acoustic tracks is reduced, the continuity in the acoustic velocity of an elastic wave between the first and second acoustic tracks is achieved. As a result, the generation of ripples in a pass band is effectively suppressed.

Accordingly, according to preferred embodiments of the present invention, outstanding filter characteristics are obtained in a longitudinally-coupled-resonator-type elastic wave filter device including a series-weighted IDT by suppressing the generation of ripples in a pass band.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Preferred embodiments of the present invention will be described in detail below with reference to the accompanying drawings.

Figure 1:
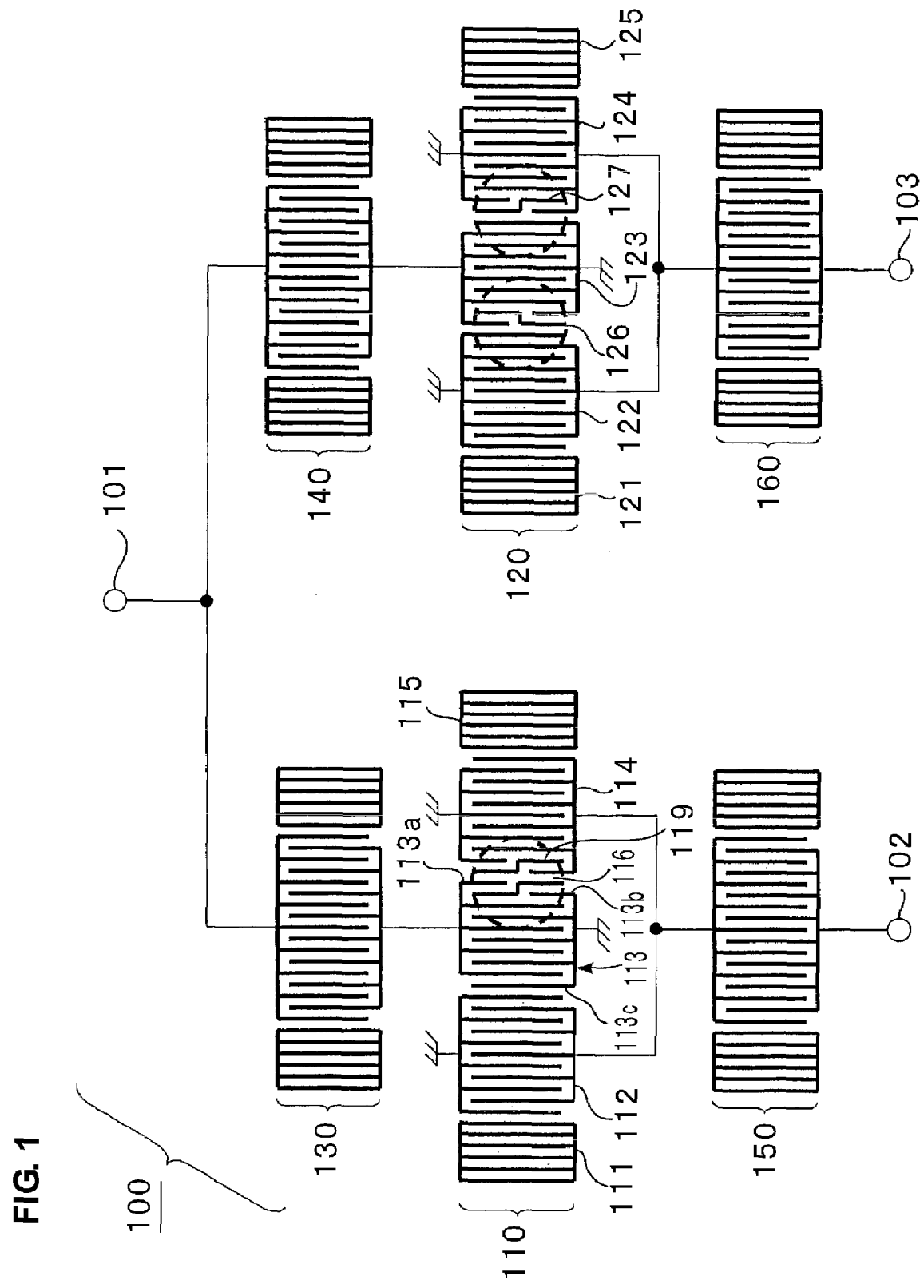
FIG. 1 is a schematic plan view illustrating an electrode configuration of a boundary acoustic wave device according to a preferred embodiment of the present invention.
Figure 2A:
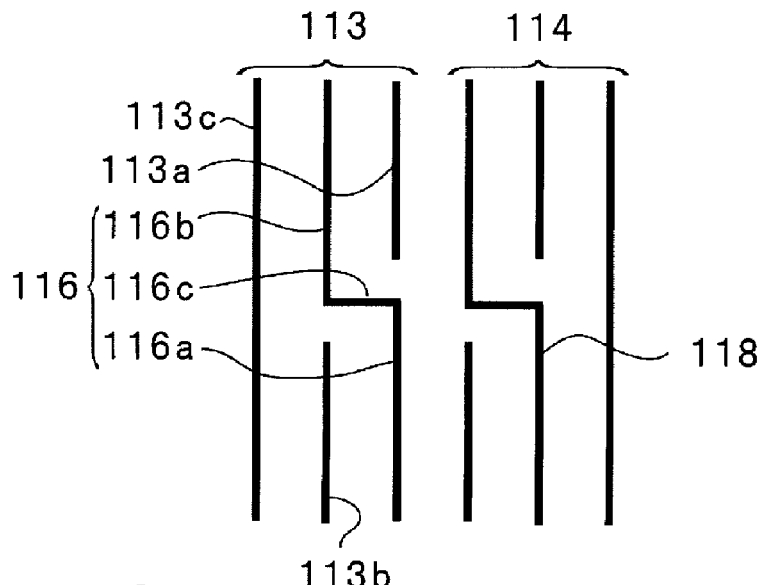
FIG. 2A is a schematic enlarged plan view illustrating the main portion of an electrode configuration of the boundary acoustic wave filter device according to a preferred embodiment of the present invention illustrated in FIG. 1.
Figure 2B:
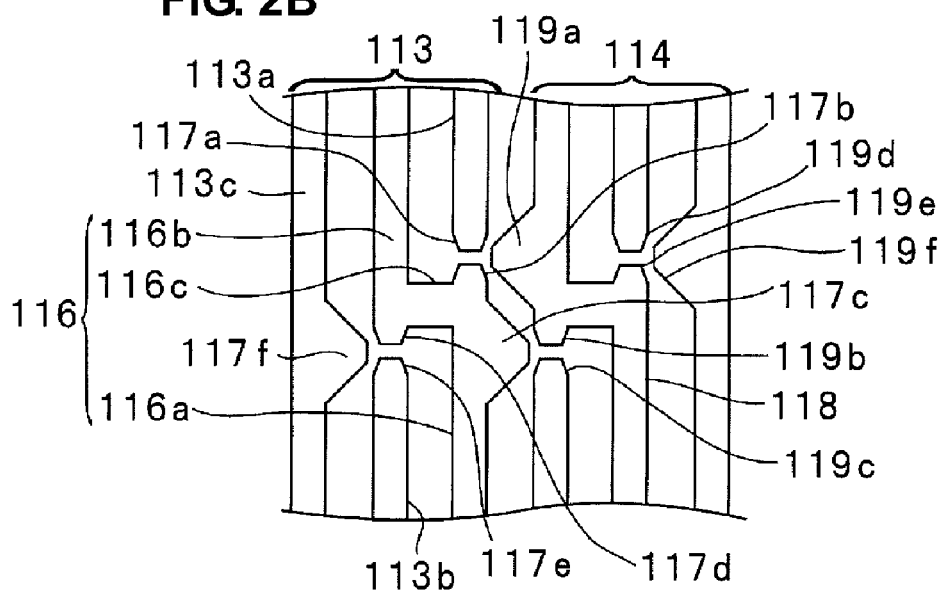
FIG. 2B is a schematic partially cutout plan view describing a metallization ratio increasing portion included in the electrode configuration.
Figure 3:
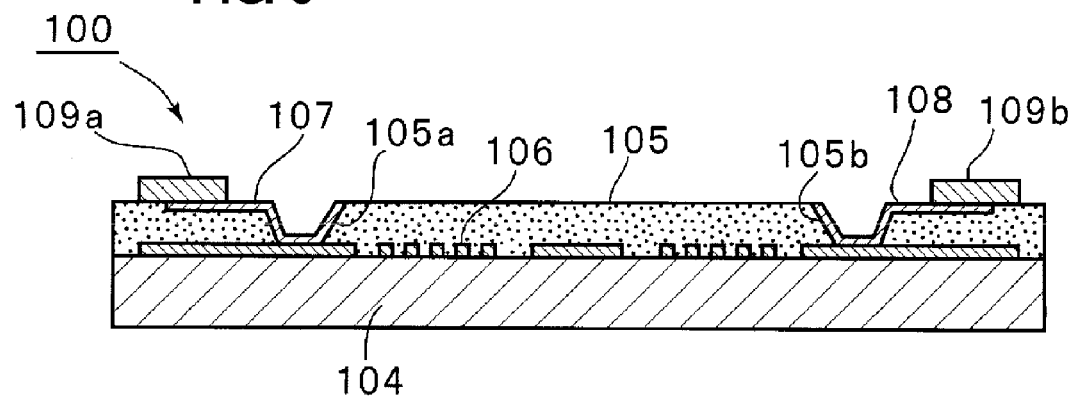
FIG. 3 is a schematic elevational cross-sectional view describing a boundary acoustic wave device according to a preferred embodiment of the present invention.

FIG. 1 is a schematic plan view illustrating an electrode configuration of a boundary acoustic wave device according to a first preferred embodiment of the present invention. FIG. 2A is a partially cutout schematic diagram illustrating the main portion of an IDT and FIG. 2B is a partially cutout enlarged plan view illustrating the main portion of the IDT. FIG. 3 is an elevational cross-sectional view of a boundary acoustic wave device according to the first preferred embodiment of the present invention.

As illustrated in FIG. 1, a boundary acoustic wave device 100 includes an unbalanced terminal 101, a first balanced terminal 102, and a second balanced terminal 103, thereby having a balanced-to-unbalanced conversion function. More specifically, the unbalanced terminal 101 is connected to a first longitudinally-coupled-resonator-type boundary acoustic wave filter portion 110 and a second longitudinally-coupled-resonator-type boundary acoustic wave filter portion 120 via a boundary acoustic wave resonator 130 and a boundary acoustic wave resonator 140, respectively. The first longitudinally-coupled-resonator-type boundary acoustic wave filter portion 110 and the second longitudinally-coupled-resonator-type boundary acoustic wave filter portion 120 are connected to a one-port boundary acoustic wave resonator 150 and a one-port boundary acoustic wave resonator 160, respectively. The first longitudinally-coupled-resonator-type boundary acoustic wave filter portion 110 and the second longitudinally-coupled-resonator-type boundary acoustic wave filter portion 120 are electrically connected to the first balanced terminal 102 and the second balanced terminal 103 via the boundary acoustic wave resonator 150 and the boundary acoustic wave resonator 160, respectively.

As schematically illustrated in FIG. 3, in the boundary acoustic wave device 100, an $SiO_2$ film 105 is disposed on a piezoelectric substrate 104 as a dielectric layer. In this preferred embodiment, the piezoelectric substrate 104 is a $LiNbO_3$ substrate having Euler angles (0°, 105°±10°, 0°). An electrode pattern 106 is disposed at an interface between the piezoelectric substrate 104 and the $SiO_2$ film 105. The electrode pattern 106 corresponds to the electrode configuration illustrated in FIG. 1.

The $SiO_2$ film 105 has a plurality of openings, an opening 105a and an opening 105b, at which a portion of the electrode pattern 106 is exposed. Conductive patterns 107 and 108 are arranged so that they are electrically connected to the exposed portion of the electrode pattern 106 at the opening 105b. The conductive patterns 107 and 108 extend from the inside of the openings 105a and 105b to the outside of the openings 105a and 105b, respectively, and are electrically connected to external electrodes 109a and 109b, respectively. Each of the external electrodes 109a and 109b corresponds to a connecting portion for electrically connecting the boundary acoustic wave filter device 100 to an external portion. For example, the external electrodes 109a and 109b correspond to any one of the unbalanced terminal 101, the balanced terminals 102 and 103, and a terminal connected to the ground potential.

Referring back to FIG. 1, the boundary acoustic wave resonators 130 and 140 each includes an IDT and reflectors disposed on either side of the IDT in a direction of propagation of a boundary acoustic wave. Each of the one-port boundary acoustic wave resonators 150 and 160 similarly includes an IDT and reflectors disposed on either side of the IDT in a direction of propagation of a boundary acoustic wave.

On the other hand, the first longitudinally-coupled-resonator-type boundary acoustic wave filter portion 110 is a 3-IDTs-longitudinally-coupled-resonator-type boundary acoustic wave filter including a first IDT 113, a second IDT 112, and a third IDT 114. The second IDT 112 and the third IDT 114 are disposed on opposite sides of the first IDT 113 in a direction of propagation of a boundary acoustic wave. On opposite sides of a region including the IDTs 112 to 114 in the direction of propagation of a boundary acoustic wave, reflectors 111 and 115 are disposed.

The second longitudinally-coupled-resonator-type boundary acoustic wave filter portion 120 similarly includes a first IDT 123, a second IDT 122, and a third IDT 124. The second IDT 122 and the third IDT 124 are disposed on opposite sides of the first IDT 123 in the direction of propagation of a boundary acoustic wave. On opposite sides of a region including the IDTs 122 to 124, reflectors 121 and 125 are disposed.

In FIG. 1, for the sake of simplification of the drawing, the numbers of electrode fingers in an IDT and gratings in a reflector illustrated in FIG. 1 are much less than the actual numbers of electrode fingers and gratings. The polarities of the outermost electrode fingers of an IDT are as illustrated in FIG. 1.

In the first longitudinally-coupled-resonator-type boundary acoustic wave filter portion 110, one end of the first IDT 113 is connected to the unbalanced terminal 101 via the boundary acoustic wave resonator 130, and the other end thereof is connected to the ground potential. One end of each of the second IDT 112 and the third IDT 114 is connected to the ground potential, and the other ends of the second IDT 112 and the third IDT 114 are connected to each other and are then connected to the first balanced terminal 102 via the boundary acoustic wave resonator 150.

In the second longitudinally-coupled-resonator-type boundary acoustic wave filter portion 120, one end of the first IDT 123 is connected to the unbalanced terminal 101 via the boundary acoustic wave resonator 140, and the other end thereof is connected to the ground potential.

One end of each of the second IDT 122 and the third IDT 124 is connected to the ground potential, and the other ends of the second IDT 122 and the third IDT 124 are connected to each other and are then electrically connected to the second balanced terminal 103 via the boundary acoustic wave resonator 160.

There is an inverse relationship between the polarity of the first IDT 113 included in the first longitudinally-coupled-resonator-type boundary acoustic wave filter portion 110 and the polarity of the first IDT 123 included in the second longitudinally-coupled-resonator-type boundary acoustic wave filter portion 120. Accordingly, if an input signal is applied from the unbalanced terminal 101, a signal output from the first balanced terminal 102 is about 180° out of phase with a signal output from the second balanced terminal 103. Consequently, the balanced-to-unbalanced conversion function is achieved.

Except that there is an inverse relationship between the polarities of the first IDT 113 and the first IDT 123, the design parameters of the second longitudinally-coupled-resonator-type boundary acoustic wave filter portion 120 and the first longitudinally-coupled-resonator-type boundary acoustic wave filter portion 110 are substantially the same.

The direction of propagation of a boundary acoustic wave is represented as an Euler angle of $\psi=20°$ in the longitudinally-coupled-resonator-type boundary acoustic wave filter portions 110 and 120, is represented as an Euler angle of $\psi=10°$ in the boundary acoustic wave resonators 130 and 140, and is represented as an Euler angle of $\psi=30°$ in the elastic boundary resonators 150 and 160. That is, the direction of propagation of a boundary acoustic wave of the longitudinally-coupled-resonator-type boundary acoustic wave filter portions 110 and 120 is different from that of the boundary acoustic wave resonators 130 and 140 and that of the boundary acoustic wave resonators 150 and 160. Thus, the electrochemical coefficients of the boundary acoustic wave resonator and the longitudinally-coupled-resonator-type elastic wave filter portion are individually set to desired values, whereby a good characteristic can be obtained.

One of the unique features of the boundary acoustic wave filter device 100 according to this preferred embodiment is that at least one of adjacent IDTs is series-weighted at least one of locations at which IDTs are adjacent to each other in each of the first longitudinally-coupled-resonator-type boundary acoustic wave filter portion 110 and the second longitudinally-coupled-resonator-type boundary acoustic wave filter portion 120 so as to improve the balance. Furthermore, by disposing a metallization ratio increasing portion, which will be described later, in a series-weighted portion, the generation of ripples in a pass band can be minimized. This feature will be described in detail.

As illustrated in FIG. 1, in a portion in which the IDTs 113 and 114 are adjacent to each other, series weighting is performed on each of the IDTs 113 and 114. That is, at the end of the IDT 113 on the side of the IDT 114, the length of a first electrode finger 113a, which is the outermost electrode finger, and a second electrode finger 113b adjacent to the first electrode finger 113a is less than that of the other electrode fingers 113c, whereby apodization weighting is performed. Furthermore, a dummy electrode finger 116 is disposed between the first electrode finger 113a and the second electrode finger 113b.

As illustrated in FIG. 2A in such a manner that the portion in which the IDTs 113 and 114 are adjacent to each other is enlarged, the dummy electrode 116 includes a first dummy electrode finger portion 116a, a second dummy electrode finger portion 116b, and a connecting portion 116c connecting the first dummy electrode finger portion 116a and the second dummy electrode finger portion 116b.

The size in the width direction of the first dummy electrode finger portion 116a and the second dummy electrode finger portion 116b, that is, the size in a direction substantially perpendicular to a direction in which the dummy electrode extends, is substantially the same as that of the first electrode finger 113a and the second electrode finger 113b. In a portion in which a protrusion, which will be described later, is provided, the size in the width direction of an electrode finger is increased.

The first dummy electrode finger portion 116a extends linearly along the extension line of the longitudinal axis of the first electrode finger 113a with a gap between it and the forward end of the first electrode finger 113a. The first dummy electrode finger portion 116a overlaps with, that is, interdigitates with the second electrode finger 113b adjacent thereto in the direction of propagation of a boundary acoustic wave.

The second dummy electrode finger portion 116b extends linearly along the extension line of the longitudinal axis of the second electrode finger 113b with a gap between it and the forward end of the second electrode finger 113b. The second dummy electrode finger portion 116b overlaps with, that is, interdigitates with the first electrode finger 113a adjacent thereto in the direction of propagation of a boundary acoustic wave.

The forward ends, that is, inner ends of the first dummy electrode finger portion 116a and the second dummy electrode finger portion 116b are connected by the connecting portion 116c extending in the direction of propagation of a boundary acoustic wave.

Thus, series weighting is performed by disposing the dummy electrode 116. As a result, as disclosed in Japanese Patent No. 3520420, the amplitude balance and the phase balance can be improved in the boundary acoustic wave filter device 100 having the balanced-to-unbalanced conversion function.

As illustrated in FIG. 2B, protrusions 117a to 117f are provided as metallization ratio increasing portions in series-weighted portions in the IDT 113. The protrusion 117a and the protrusion 117e are trapezoidal portions, for example, provided at the forward ends of the first electrode finger 113a and the second electrode finger 113b, respectively. That is, a tapered trapezoidal portion is provided at the forward ends of the first electrode finger having no protrusion 117a and the second electrode finger having no protrusion 117e.

On the other hand, the protrusion 117b and the protrusion 117d are trapezoidal portions protruding from the connecting portion 116c, and face the protrusion 117a and the protrusion 117e, respectively. The protrusions 117a, 117b, 117d, and 117e are used to increase the metallization ratio of a second acoustic track located on either side of a first acoustic track passing through the connecting portion 116c. The first and second acoustic tracks will be described later.

The protrusion 117c preferably is a trapezoidal portion, for example. The trapezoidal portion is a portion of the first dummy electrode finger portion 116a in the dummy electrode 116 which is located in the second acoustic track and which protrudes in the direction of propagation of a boundary acoustic wave. The protrusion 117f preferably is a trapezoidal portion, for example. The trapezoidal portion is a portion of an electrode finger 113c adjacent to the second electrode finger 113b which is located in the second acoustic track and which protrudes in the direction of propagation of a boundary acoustic wave. The protrusions 117c and 117f are also used to increase the metallization ratio of the second acoustic track.

Accordingly, in the IDT 113, the metallization ratio of the second acoustic track is increased so as to minimize the difference between the metallization ratios of the first acoustic track passing through the connecting portion 116c and the second acoustic track.

In the IDT 114 adjacent to the IDT 113, a dummy electrode 118 is disposed for series weighting. In the IDT 114, protrusions 119a to 119f are similarly disposed so as to relatively increase the metallization ratio of the second acoustic track and minimize the difference between the metallization ratios of the first acoustic track and the second acoustic track.

Figure 4:
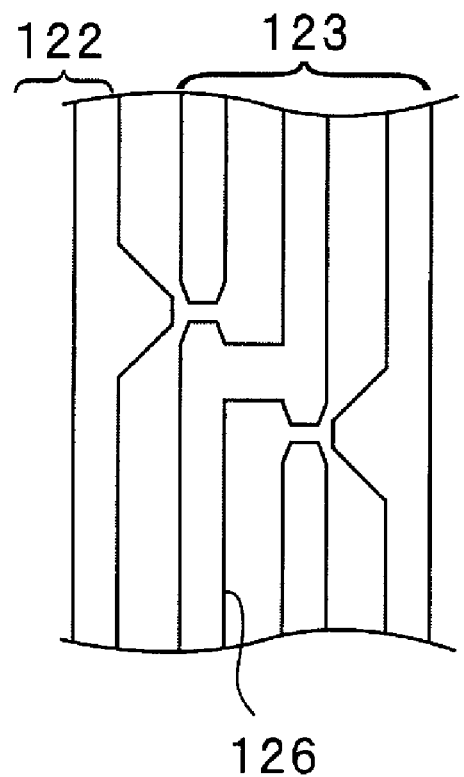
FIG. 4 is a partially cutout enlarged plan view illustrating a portion in which a first IDT and a second IDT are adjacent to each other in a second longitudinally-coupled-resonator-type boundary acoustic wave filter portion in a boundary acoustic wave device according to a preferred embodiment of the present invention.

In a portion in which the IDTs 122 and 123 are adjacent to each other in FIG. 1, as illustrated in FIG. 4, a dummy electrode 126 is disposed in the IDT 123. Furthermore, similar to the IDT 114 in the portion in which the IDTs 113 and 114 are adjacent to each other, a portion arranged to increase the metallization ratio of the second acoustic track is disposed in the IDT 123 so as to minimize the difference between the metallization ratios of the first acoustic track and the second acoustic track. In the portion in which the IDTs 122 and 123 are adjacent to each other, however, the metallization ratio increasing portion is only disposed in the IDT 123.

Figure 5:
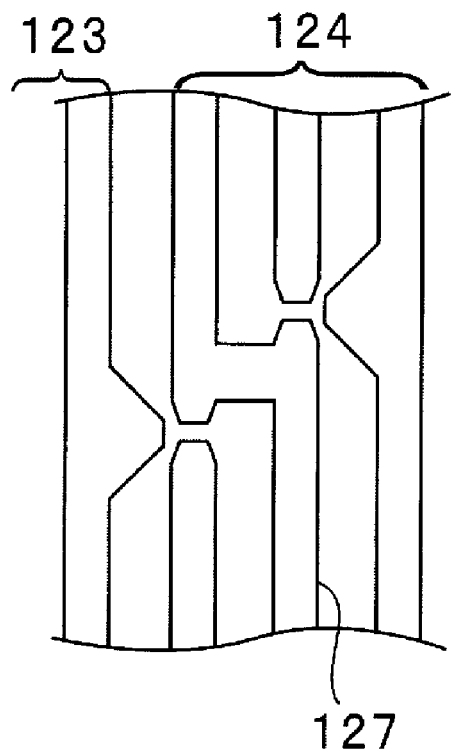
FIG. 5 is a partially cutout enlarged plan view illustrating a portion in which the first IDT and a third IDT are adjacent to each other in the second longitudinally-coupled-resonator-type boundary acoustic wave filter portion in a boundary acoustic wave device according to a preferred embodiment of the present invention.

In a portion in which the IDTs 123 and 124 are adjacent to each other, as illustrated in FIG. 5, a dummy electrode 127 is disposed in the IDT 124. Furthermore, in a portion series-weighted by the dummy electrode 127 in the IDT 124, the metallization ratio increasing portion arranged to increase the metallization ratio of the second acoustic track is similarly disposed so as to minimize the difference between the metallization ratios of the first acoustic track and the second acoustic track.

In a longitudinally-coupled-resonator-type boundary acoustic wave filter device according to this preferred embodiment, as described previously, series weighting is performed upon the IDTs 113, 114, 123, and 124 and the metallization ratio increasing portions arranged to increase the metallization ratio of the second acoustic track is disposed in a series-weighted portion. Accordingly, the generation of ripples in the pass band is minimized. The minimization of the generation of ripples will be described with reference to FIGS. 6 and 7.

Figure 6:
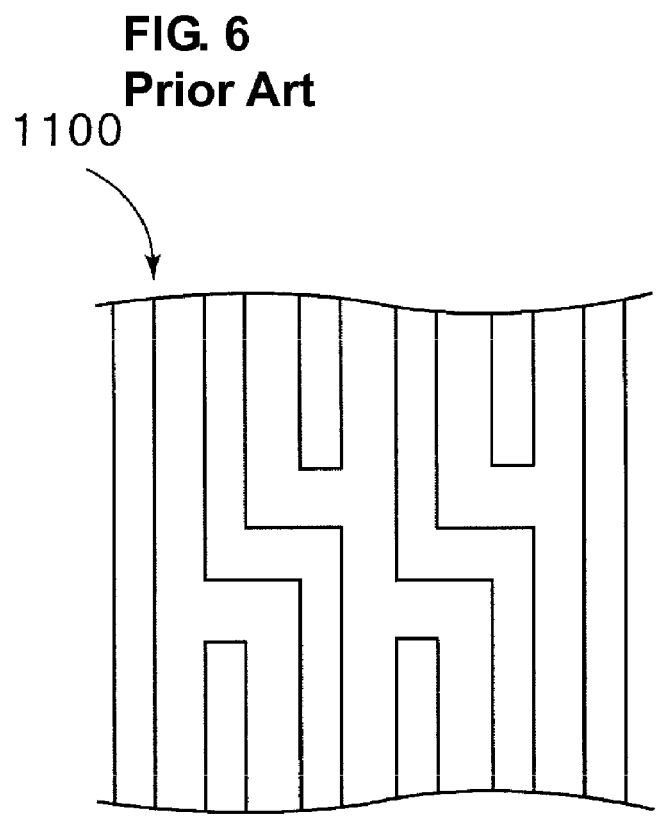
FIG. 6 is a partially cutout enlarged plan view describing an electrode configuration of a boundary acoustic wave filter device in the related art which does not include a metallization ratio increasing portion and a metallization ratio reducing portion.
Figure 7:
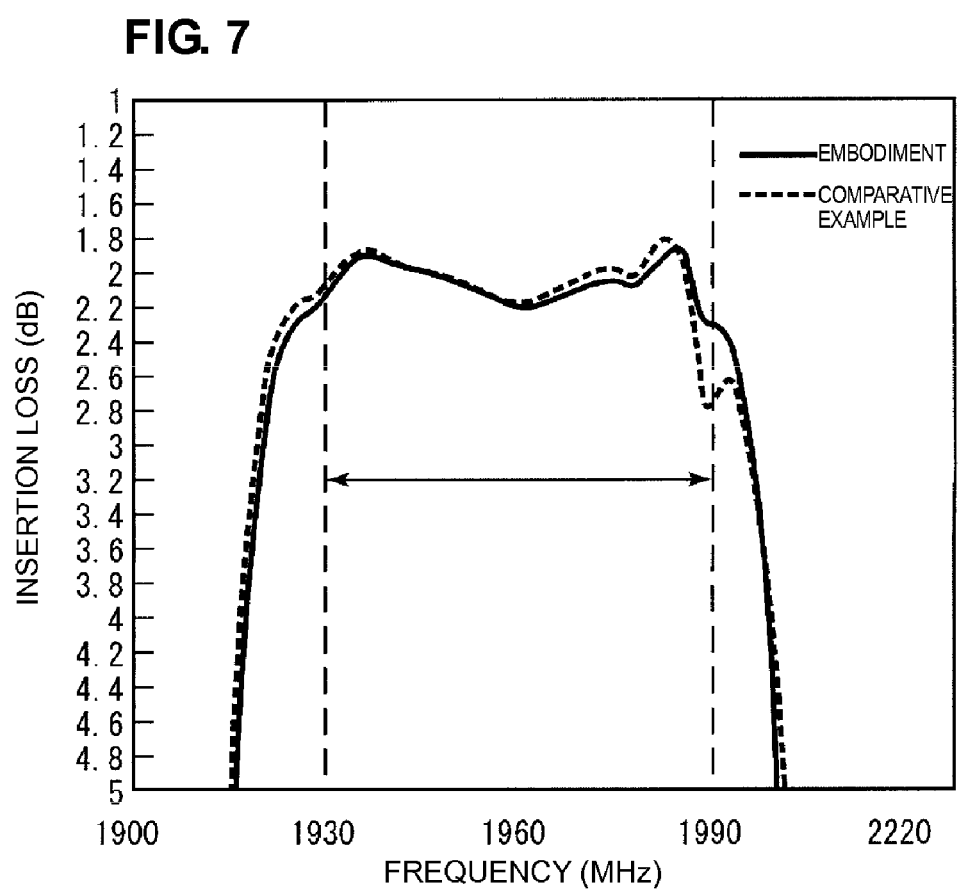
FIG. 7 is a diagram illustrating filter characteristics of a longitudinally-coupled-resonator-type boundary acoustic wave filter device according to a preferred embodiment of the present invention and a boundary acoustic wave filter device prepared as a comparative example.

FIG. 7 is a diagram illustrating a filter characteristic in a case in which this preferred embodiment is used for a receiving bandpass filter for a PCS mobile telephone. In FIG. 7, a solid line denotes a filter characteristic according to this preferred embodiment. The receiving pass band of this bandpass filter is about 1930 MHz to about 1990 MHz. A broken line denotes a filter characteristic of a boundary acoustic wave filter device according to a comparative example which has the same configuration as that of the above-described bandpass filter except that the boundary acoustic wave filter device includes no metallization ratio increasing portions. That is, the broken line denotes a filter characteristic of a boundary acoustic wave filter device 1100 in the related art having a series-weighting configuration that is illustrated in FIG. 6 as a comparative example of the series-weighting configuration illustrated in FIG. 2.

As shown in FIG. 7, in the boundary acoustic wave filter device according to the comparative example, the level of ripple generated around 1990 MHz is very high. On the other hand, according to this preferred embodiment, the level of ripple generated around 1990 MHz can be improved by approximately 0.5 dB. Furthermore, in the boundary acoustic wave filter device according to the comparative example, the insertion loss in the pass band is about 2.8 dB. According to this preferred embodiment, the improved insertion loss of about 2.3 dB can be obtained.

The reason why the level of ripple generated in the pass band can be reduced as described previously will be described below.

Figure 9:
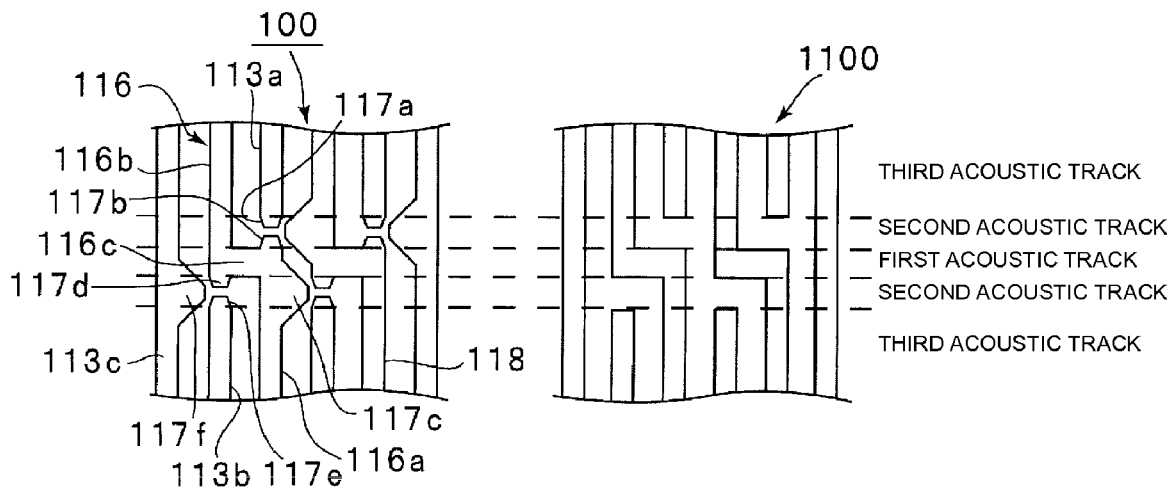
FIG. 9 is a schematic plan view describing metallization ratios in first to third acoustic tracks in each of a boundary acoustic wave filter device according to a preferred embodiment of the present invention and a boundary acoustic wave filter device in the related art which is prepared as a comparative example.

As illustrated in a drawing on the right side of FIG. 9, in the boundary acoustic wave filter device 1100 according to a comparative example, the IDT duty is discontinuous in a series-weighted portion in the interdigital-width direction. As a result, the distribution of acoustic velocities of a boundary acoustic wave is exhibited. That is, since the acoustic velocity of a boundary acoustic wave in the first acoustic track is different from that of a boundary acoustic wave in each of the second acoustic tracks, a boundary acoustic wave discontinuous portion is generated. As a result, the boundary acoustic wave is scattered and ripples are generated.

On the other hand, as illustrated in a drawing on the left side of FIG. 9, in the boundary acoustic wave filter device 100 according to this preferred embodiment, the metallization ratio increasing portions arranged to increase the metallization ratio of the second acoustic track are disposed so as to minimize the difference between the metallization ratios of the first acoustic track and the second acoustic track. As a result, the difference between the acoustic velocity of a boundary acoustic wave in the first acoustic track and the acoustic velocity of a boundary acoustic wave in the second acoustic track is reduced. This lessens the discontinuity in the acoustic velocity of a boundary acoustic wave. Consequently, the level of ripple is reduced as described previously.

The first to third acoustic tracks denote regions obtained by partitioning a boundary acoustic wave propagation region in accordance with the above-described electrode configuration. The first to third acoustic tracks are regions extending in the direction of propagation of a boundary acoustic wave. The first acoustic track is a region including the connecting portion of the above-described dummy electrode. The second acoustic track is a region disposed on each side of the first acoustic track in a direction substantially perpendicular to the direction of propagation of a boundary acoustic wave, that is, a region between the forward end of the first electrode finger and the connecting portion and a region between the forward end of the second electrode finger and the connecting portion. The third track is a region outside the second acoustic track in which the first electrode finger or the second electrode finger is disposed.

Figure 8:
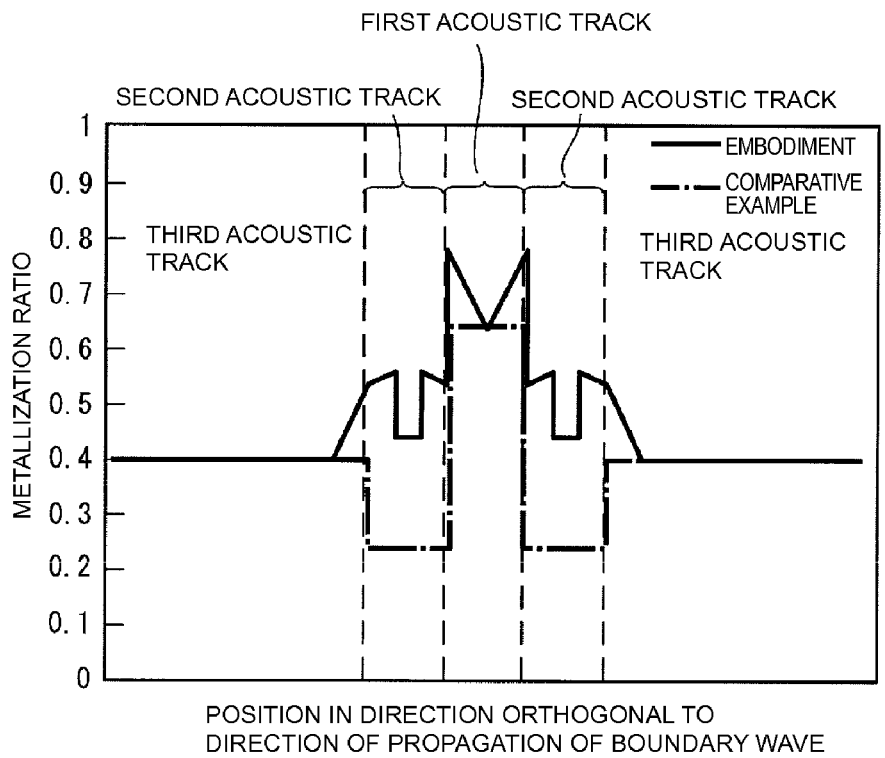
FIG. 8 is a schematic diagram describing metallization ratios in first to third acoustic tracks in each of a boundary acoustic wave filter device according to a preferred embodiment of the present invention and a boundary acoustic wave filter device prepared as a comparative example.

FIG. 8 is a diagram illustrating the distribution of metallization ratios of the first to third acoustic tracks in the IDT 113 in the first longitudinally-coupled-resonator-type boundary acoustic wave filter device 100 and the distribution of metallization ratios in corresponding portions in the boundary acoustic wave filter device 1100 according to a comparative example. The metallization ratio is the ratio of an electrode area, that is, a metallized area to the entire area on the piezoelectric substrate of an elastic wave filter device. As shown in FIG. 8, in the boundary acoustic wave filter device according to a comparative example, the metallization ratio of the first acoustic track is significantly different from that of the second acoustic track. That is, the metallization ratio is changed from about 0.65 to about 0.25 at the boundary between the first acoustic track and the second acoustic track. That is, the difference between the metallization ratios of the first acoustic track and the second acoustic track is about 0.4 at the boundary therebetween. The metallization ratio is changed from about 0.25 to about 0.40 at the boundary between the second acoustic track and the third acoustic track. On the other hand, in this preferred embodiment, since the protrusions 117a to 117f are disposed, the metallization ratio of a portion in which the second acoustic track and the first acoustic track are adjacent to each other is increased and the difference between the metallization ratios of the first acoustic track and the second acoustic track is significantly reduced. That is, the difference between the metallization ratios of the first acoustic track and the second acoustic track is about 0.2 at the boundary between the first acoustic track and the second acoustic track. Thus, the difference between the metallization ratios of the first acoustic track and the second acoustic track is reduced by half as compared to the difference between the metallization ratios of the first acoustic track and the second acoustic track in a comparative example.

Accordingly, in this preferred embodiment, it can be observed that the discontinuity in the acoustic velocity of a boundary acoustic wave is reduced and the generation of ripples is suppressed by reducing the difference between the metallization ratios of the first acoustic track and the second acoustic track.

In the above-described preferred embodiment, as illustrated in FIGS. 2, 4, and 5, by disposing protrusions in the IDTs 113 and 114 or the IDTs 123 and 124, the metallization ratio of the second acoustic track is increased. Other protrusions different from the protrusions illustrated in FIGS. 2, 4, and 5 may be used. Exemplary modifications of a protrusion are illustrated in FIGS. 10A to 10D and FIGS. 11A to 11C. In FIGS. 10A to 10D and FIGS. 11A to 11C, a portion corresponding to the portion illustrated in FIGS. 2A and 2A in which the IDTs 113 and 114 are adjacent to each other is illustrated.

Figure 10A:
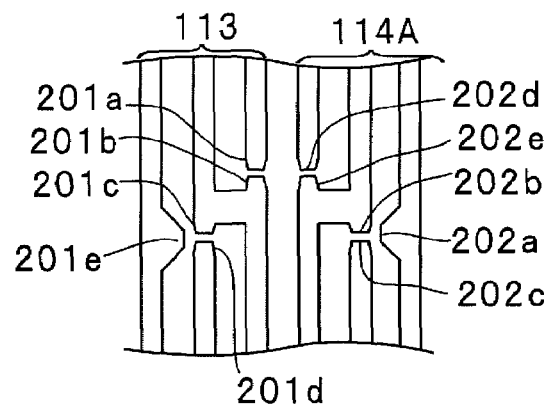
FIGS. 10A to 10D are partially cutout plan views describing exemplary modifications of a configuration including the metallization ratio increasing portion.

As illustrated in FIG. 10A, protrusions 201a to 201e may be disposed in the IDT 113, and protrusions 202a to 202e may be disposed in an IDT 114A. In this example, the protrusion 117c illustrated in FIG. 2B is not included. The polarity of the IDT 114A is opposite to the polarity of the IDT 114 illustrated in FIG. 2A. Furthermore, a protrusion corresponding to the protrusion 119a illustrated in FIG. 2B is not included. Except for these points, the configuration illustrated in FIG. 10A is the same as that illustrated in FIG. 2B.

Figure 10B:
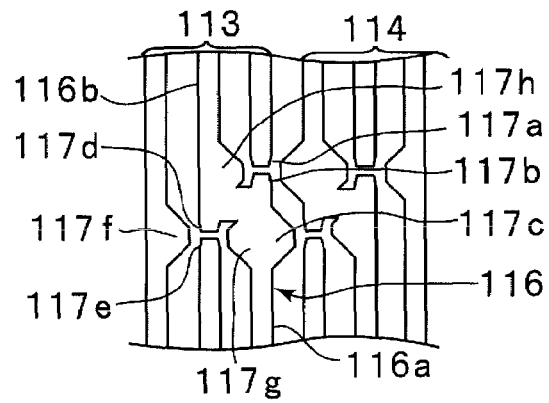

Referring to FIG. 10B, in addition to the protrusions 117a to 117f illustrated in FIG. 2B, protrusions 117g and 117h are disposed in the IDT 113. The protrusion 117g and the protrusion 117h are trapezoidal portions protruding from the first dummy electrode finger portion 116a and the second dummy electrode finger portion 116b in the direction of propagation of a boundary acoustic wave, respectively.

Figure 10C:
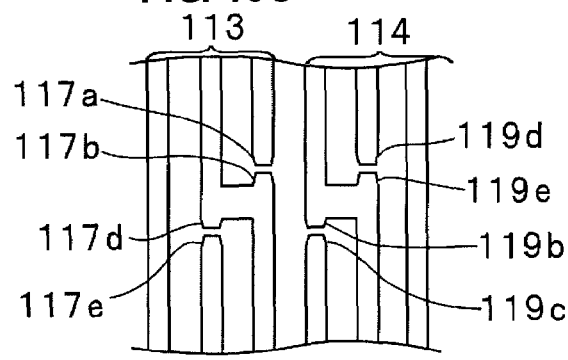

Referring to FIG. 10C, the protrusions 117f, 117c, 119a, and 119f illustrated in FIG. 2B are not included.

Figure 10D:
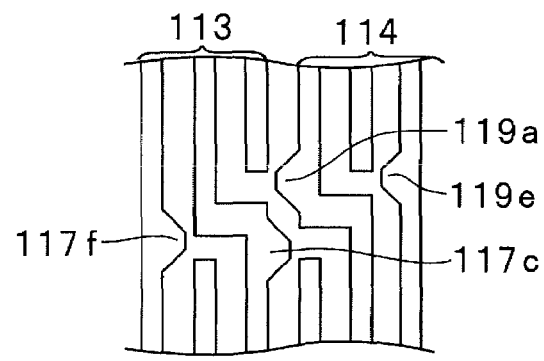

Referring to FIG. 10D, only the protrusions 117c, 117f, 119a, and 119e illustrated in FIG. 2B are used as the metallization ratio increasing portions.

With only one of the protrusions 117c, 117f, 119a, and 119e, the metallization ratio can be increased.

Figure 11A:
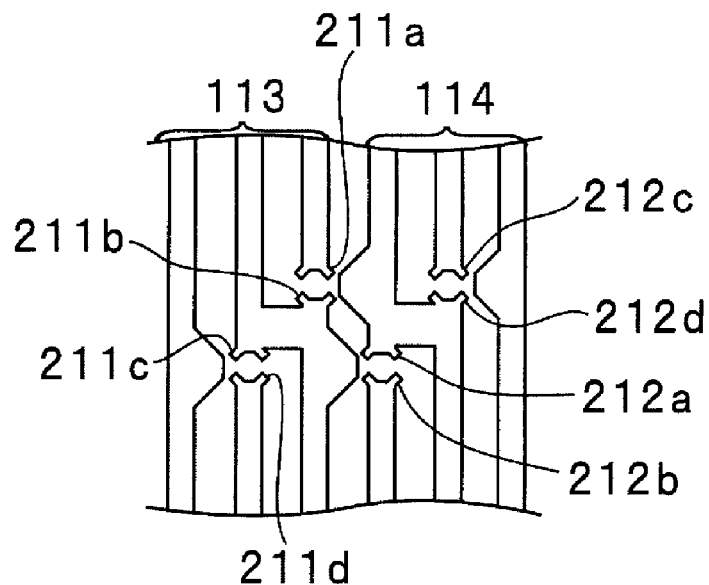
FIGS. 11A to 11C are partially cutout plan views describing exemplary modifications of a configuration including the metallization ratio increasing portion.

Referring to FIG. 11A, in addition to the protrusions 117c, 117f, 119a, and 119f illustrated in FIG. 2B, horn-shaped protrusions 211a, 211b, 211c, 211d, 212a, 212b, 212c, and 212d are disposed as the metallization ratio increasing portions.

Figure 11B:
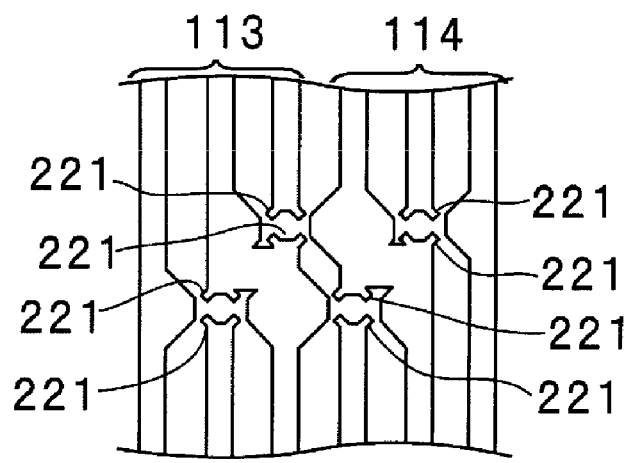
Figure 11C:
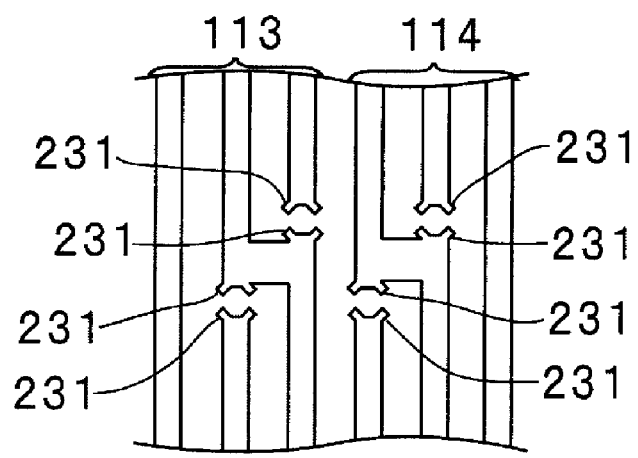

As illustrated in FIGS. 11B and 11C, each trapezoidal protrusion illustrated in FIG. 10B and each trapezoidal protrusion illustrated in FIG. 10C may be replaced with protrusions 221 and 231 each having two horn-shaped portions, respectively.

As is apparent from FIGS. 10A to 11C, the shape and position of a protrusion for increasing the metallization ratio of the second acoustic track can be changed as appropriate as long as the protrusion increases the metallization ratio of the second acoustic track.

As is apparent from the above-described preferred embodiment, the generation of ripples can be suppressed by reducing the difference between the metallization ratios of the first acoustic track and the second acoustic track. Accordingly, by reducing the metallization ratio of the first acoustic track instead of increasing the metallization ratio of the second acoustic track, the generation of ripples can also be suppressed. That is, in preferred embodiments of the present invention, metallization ratio reducing portions arranged to reduce the metallization ratio of the first acoustic track may be disposed.

Figure 12A:
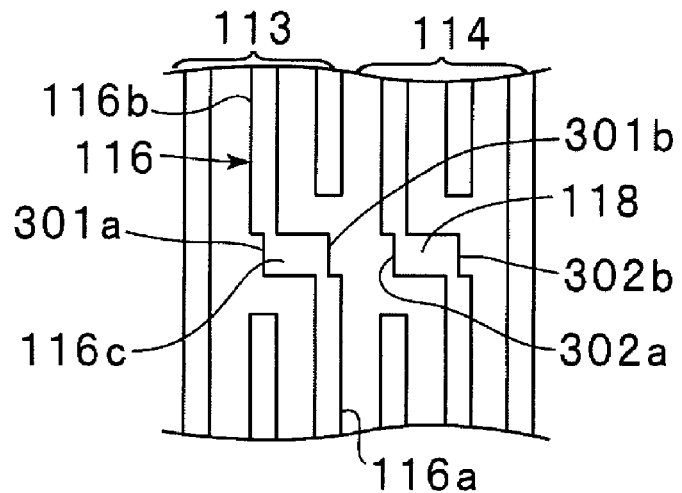
FIGS. 12A to 12C are partially cutout plan views describing examples of the metallization ratio reducing portion used in preferred embodiments of the present invention.
Figure 12B:
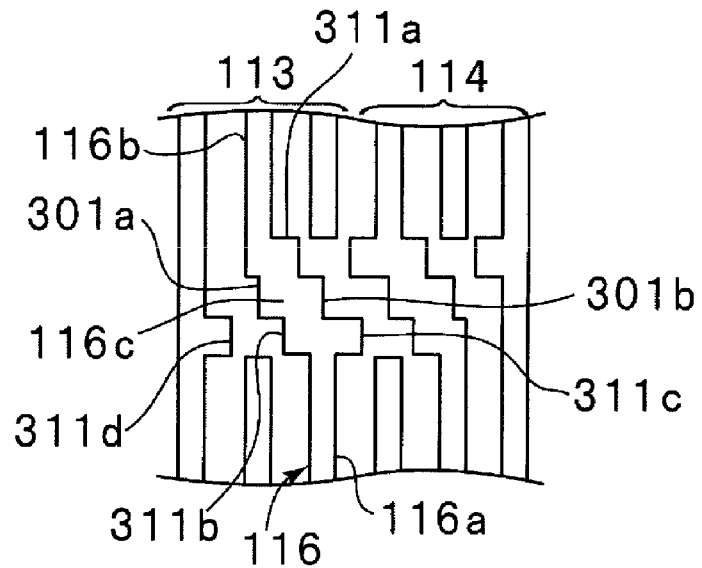
Figure 12C:
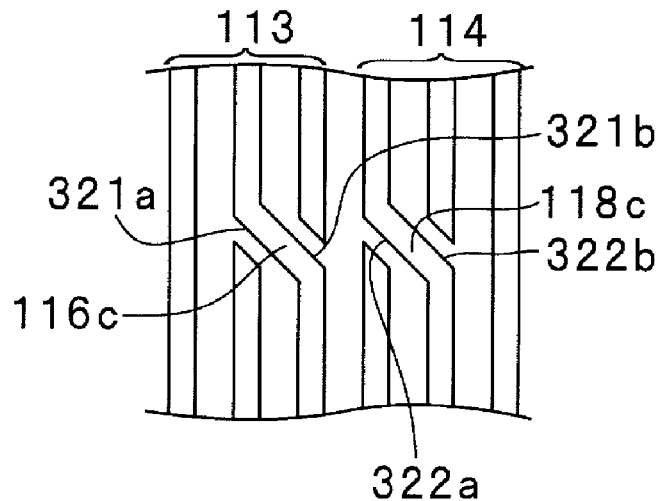

FIGS. 12A to 12C are schematic partially cutout plan views illustrating a configuration including the metallization ratio reducing portions arranged to reduce the metallization ratio of the first acoustic track. Here, the configuration of a portion in which the IDTs 113 and 114 are adjacent to each other and the metallization ratio reducing portions are disposed is schematically illustrated. That is, the portion illustrated in FIGS. 12A to 12C corresponds to the portion illustrated in FIGS. 2A and 2B.

As illustrated in FIG. 12A, electrode cutout portions 301a and 301b are provided in the connecting portion 116c of the dummy electrode 116 included in the IDT 113. As a result, the area of the connecting portion 116c becomes less than that of the connecting portion 116c according to the above-described preferred embodiment, and the metallization ratio of the first acoustic track is therefore reduced. Electrode cutout portions 302a and 302b are similarly provided in the connecting portion of the dummy electrode 118 included in the IDT 114. As a result, the area of the connecting portion becomes less than that of the connecting portion according to the above-described preferred embodiment, and the metallization ratio of the first acoustic track is therefore reduced. Consequently, the difference between the metallization ratios of the first acoustic track and the second acoustic track is reduced. Similar to the above-described preferred embodiment, in this preferred embodiment, the generation of ripples is suppressed.

As illustrated in FIG. 12B, not only the metallization ratio reducing portions arranged to reduce the metallization ratio of the first acoustic track but also rectangular protrusions 311a to 311d functioning as the metallization ratio increasing portions arranged to increase the metallization ratio of the second acoustic track may be disposed. That is, in preferred embodiments of the present invention, both of the metallization ratio increasing portions and the metallization ratio reducing portions may be used.

As illustrated in FIG. 12C, in order to reduce the metallization ratio, electrode cutout portions may be individually disposed in connecting portions 116c and 118c so that the connecting portions 116c and 118c interdigitate with each other not in a direction substantially parallel to the direction of propagation of a boundary acoustic wave but in an oblique direction with respect to the direction of propagation of a boundary acoustic wave. That is, in FIG. 12C, in order to reduce the metallization ratio of the first acoustic track, electrode cutout portions 321a and 321b are disposed in the connecting portion 116c and electrode cutout portions 322a and 322b are disposed in the connecting portion 118c so that each of the connecting portions 116c and 118c extending in the direction of propagation of a boundary acoustic wave has an edge extending in an oblique direction with respect to the direction of propagation of a boundary acoustic wave.

As described previously, the shape of an electrode cutout portion for reducing the metallization ratio of the first acoustic track is not particularly limited.

In the above-described preferred embodiment and the above-described exemplary modifications, a LiNbO$_3$ monocrystal substrate is used as a piezoelectric substrate. However, a piezoelectric substrate made of another piezoelectric monocrystal such as LiTaO$_3$ or crystal or a piezoelectric substrate made of piezoelectric ceramics may be used. A dielectric layer may be made of not only SiO$_2$ but also another dielectric material such as a silicon oxide film or a silicon nitride film.

An IDT preferably includes a metal layer made of a material selected from the group consisting of Au, Pt, Pd, Ag, Cu, W, and an alloy primarily including one of Au, Pt, Pd, Ag, Cu, and W. In this case, since the metal layer is heavy, the difference between the elastic wave acoustic velocities in the first and second acoustic tracks becomes large with no metallization ratio increasing portions and/or metallization ratio reducing portions. As a result, a high level of ripple is generated in the pass band. On the other hand, according to preferred embodiments of the present invention, even if an IDT includes such a heavy metal layer, the difference between the elastic wave acoustic velocities in the first and second acoustic tracks is small. Consequently, the level of ripple generated in the pass band is reduced. In the present invention, however, a metal material used for an IDT is not particularly limited.

The present invention is not limited to a boundary acoustic wave device having the electrode configuration illustrated in FIG. 1. Exemplary modifications of a boundary acoustic wave device according to the first preferred embodiment will be described with reference to FIGS. 13 to 15.

Figure 13:
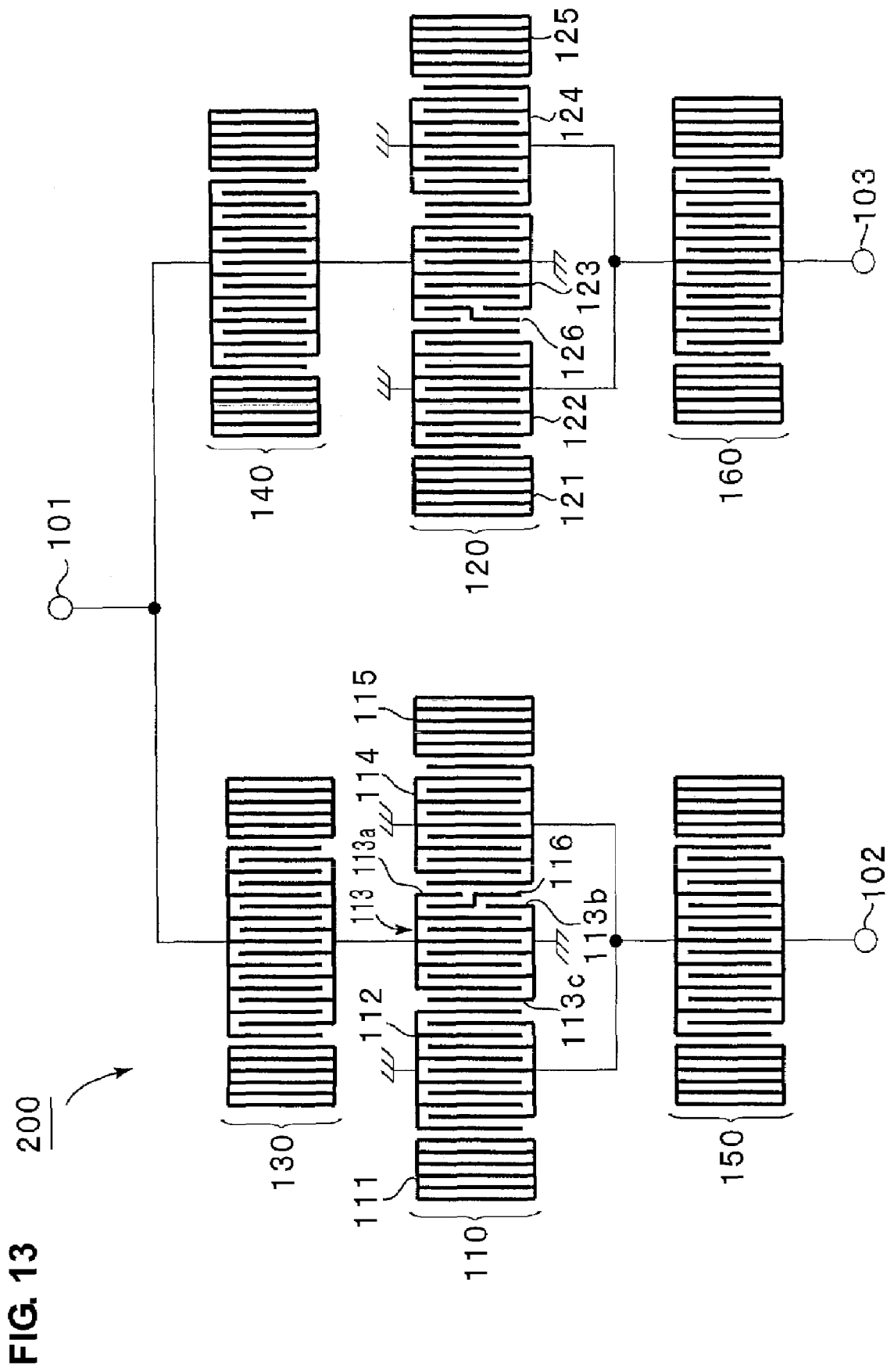
FIG. 13 is a schematic plan view illustrating an electrode configuration of a boundary acoustic wave filter device according to an exemplary modification of the present invention.

A boundary acoustic wave device 200 according to an exemplary modification illustrated in FIG. 13 has the same configuration as that of a boundary acoustic wave device according to the first preferred embodiment except that the third IDT 114 is not weighted in a portion in which the first IDT 113 and the third IDT 114 are adjacent to each other in the first longitudinally-coupled-resonator-type boundary acoustic wave filter portion 110 and the third IDT 124 is not weighted in the second longitudinally-coupled-resonator-type boundary acoustic wave filter portion 120.

Figure 14:
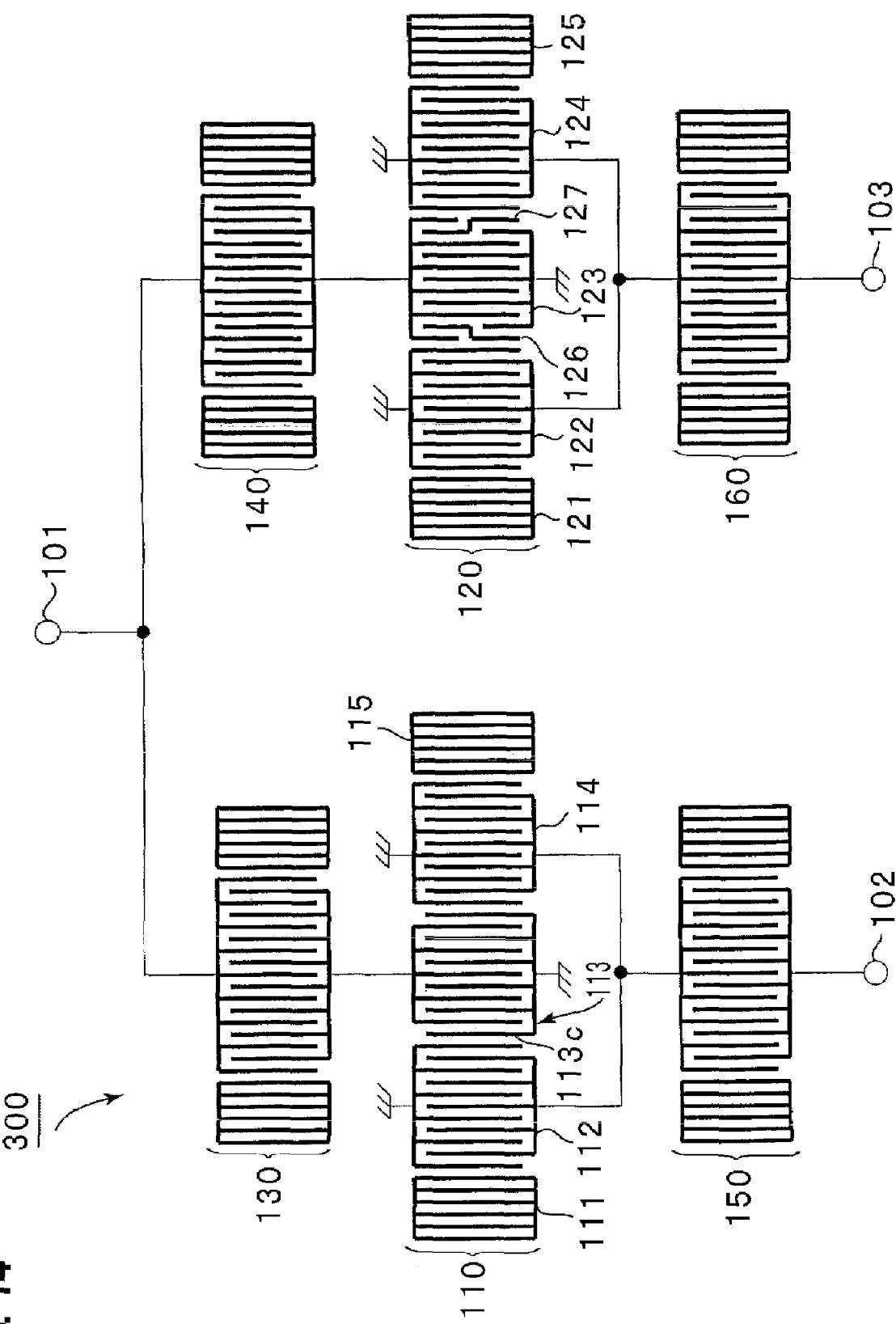
FIG. 14 is a schematic plan view illustrating an electrode configuration of a boundary acoustic wave filter device according to another exemplary modification of the present invention.

A boundary acoustic wave filter device 300 illustrated in FIG. 14 has the same configuration as that of a boundary acoustic wave device according to the first preferred embodiment except that all of the IDTs included in the first longitudinally-coupled-resonator-type boundary acoustic wave filter 110 are not weighted, the third IDT 124 is not weighted in the second longitudinally-coupled-resonator-type boundary acoustic wave filter, and the ends on either side of the first IDT 123 in the direction of propagation of a boundary acoustic wave are series-weighted in a portion in which the first IDT 123 and the third IDT 124 are adjacent to each other.

Figure 15:
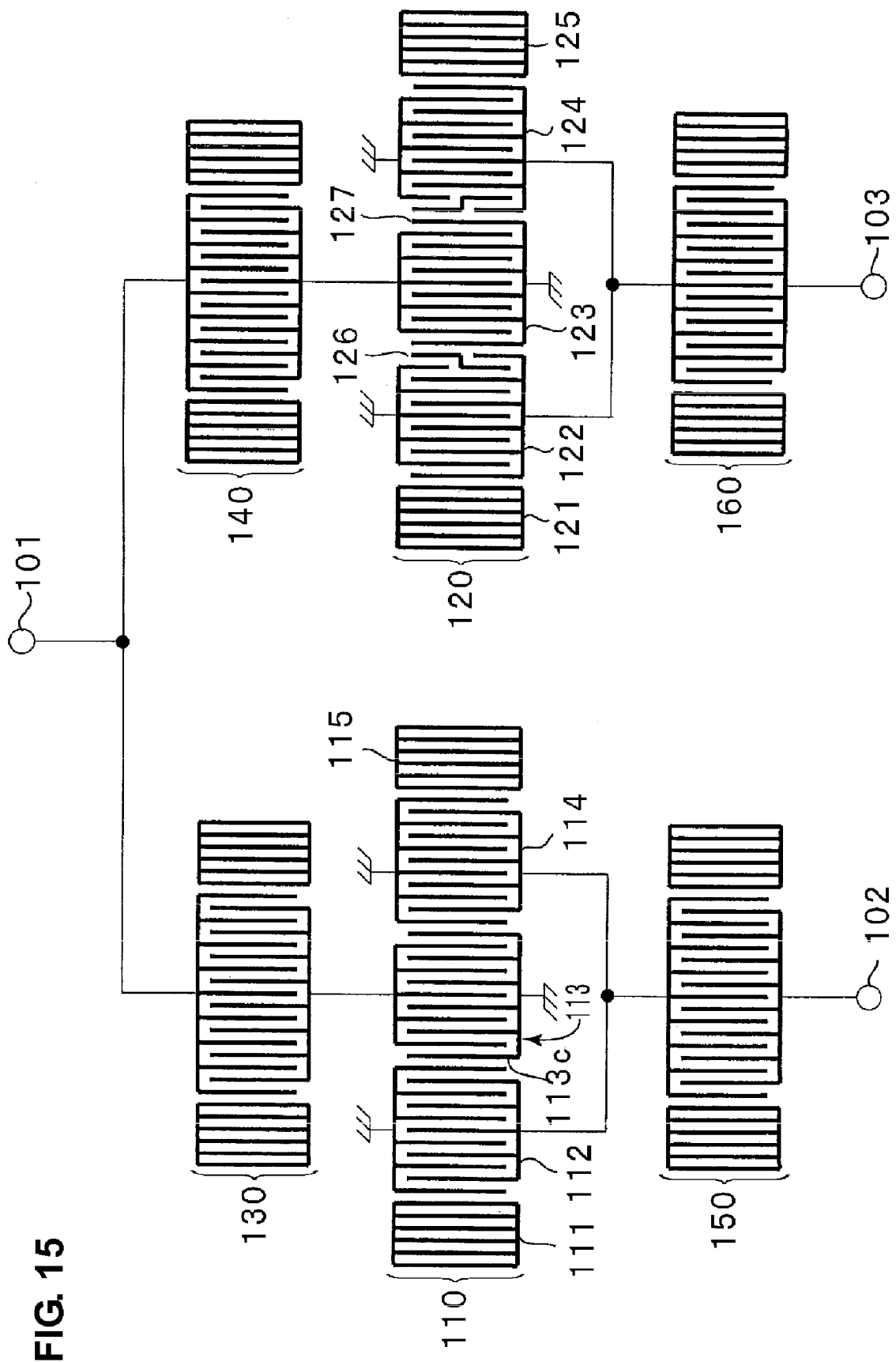
FIG. 15 is a schematic plan view illustrating an electrode configuration of a boundary acoustic wave filter device according to still another exemplary modification of the present invention.

Unlike a boundary acoustic wave device according to the first preferred embodiment, in a boundary acoustic wave device according to an exemplary modification illustrated in FIG. 15, all of the IDTs included in the first longitudinally-coupled-resonator-type boundary acoustic wave filter portion 110 are not weighted, and the second IDT 122 is weighted in a portion in which the first IDT 123 and second IDT 122 are adjacent to each other in the second longitudinally-coupled-resonator-type boundary acoustic wave filter.

Furthermore, unlike a boundary acoustic wave device according to the first preferred embodiment, the polarity of the second IDT 112 and the third IDT 114 in the first longitudinally-coupled-resonator-type boundary acoustic wave filter portion 110 are opposite to the polarity of the second IDT 122 and the third IDT 124 in the second longitudinally-coupled-resonator-type boundary acoustic wave filter portion 120.

Similar the above-described preferred embodiment, in the case of exemplary modifications illustrated in FIGS. 13 to 15, by disposing the metallization ratio reducing portions arranged to reduce the metallization ratio of the first acoustic track and/or the metallization ratio increasing portions arranged to increase the metallization ratio of the second acoustic track in at least one of series-weighted portions in an IDT so as to minimize the difference between the metallization ratios of the first acoustic track and the second acoustic track, the generation of ripples in the pass band is suppressed.

Figure 16:
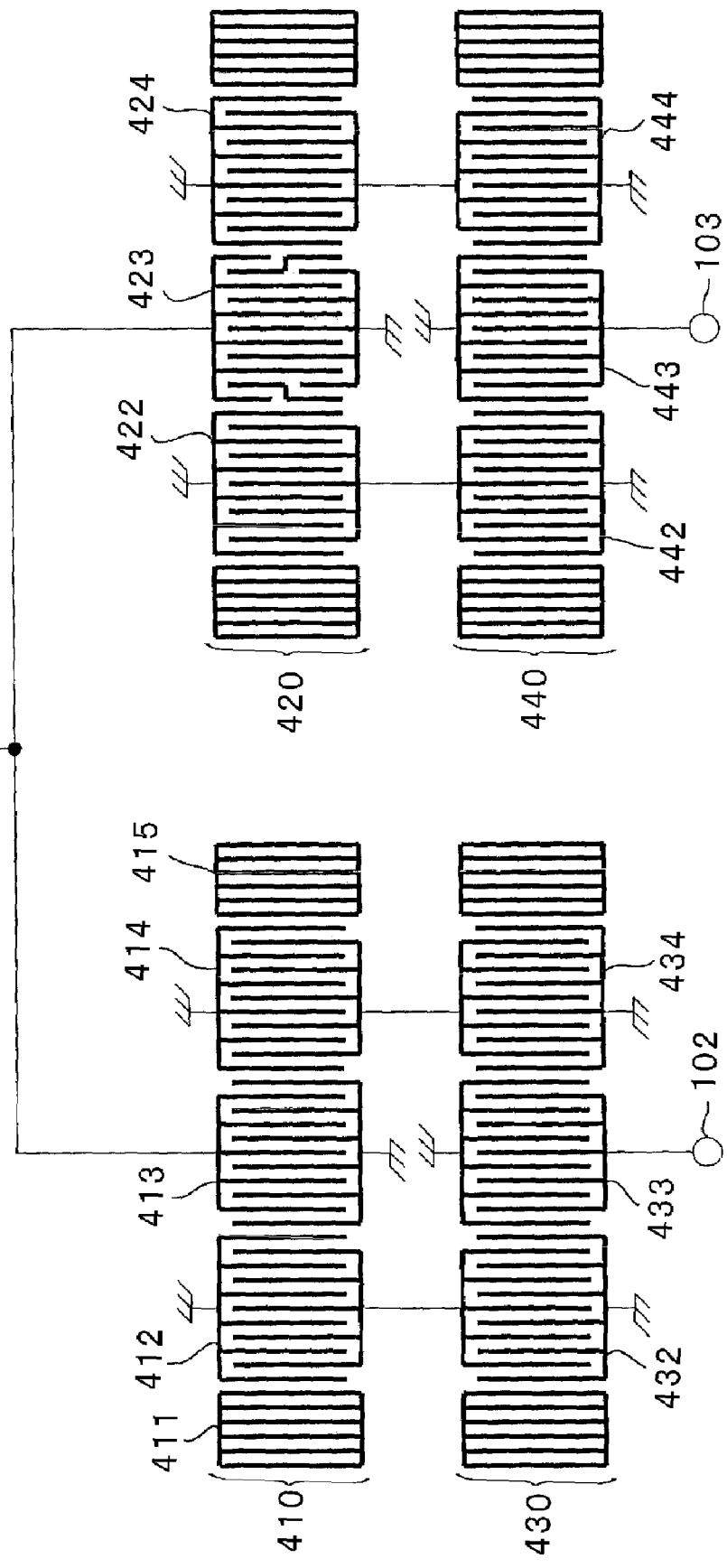
FIG. 16 is a schematic plan view illustrating an electrode configuration of a boundary acoustic wave filter device according to another exemplary modification of the present invention.

FIG. 16 is a schematic plan view of a longitudinally-coupled-resonator-type boundary acoustic wave filter device 400 according to still another exemplary modification of an elastic wave device according to the present invention. The unbalanced terminal 101 is connected to a first longitudinally-coupled-resonator-type boundary acoustic wave filter portion 410 and a second longitudinally-coupled-resonator-type boundary acoustic wave filter portion 420. The first longitudinally-coupled-resonator-type boundary acoustic wave filter portion 410 and the second longitudinally-coupled-resonator-type boundary acoustic wave filter portion 420 are connected to a third longitudinally-coupled-resonator-type boundary acoustic wave filter portion 430 and a fourth longitudinally-coupled-resonator-type boundary acoustic wave filter portion 440, respectively. All of the longitudinally-coupled-resonator-type boundary acoustic wave filter portions 410 to 440 are 3-IDTs-longitudinally-coupled-resonator-type boundary acoustic wave filter portions.

One end of a second IDT 412 included in the first longitudinally-coupled-resonator-type boundary acoustic wave filter portion 410 is electrically connected to one end of a second IDT 432 included in the third longitudinally-coupled-resonator-type boundary acoustic wave filter portion 430, and one end of a third IDT 414 included in the first longitudinally-coupled-resonator-type boundary acoustic wave filter portion 410 is electrically connected to one end of a third IDT 434 included in the third longitudinally-coupled-resonator-type boundary acoustic wave filter portion 430. The other ends of the IDTs 412, 414, 432, and 434 are connected to the ground potential. One end of a first IDT 413 at the center of the first longitudinally-coupled-resonator-type boundary acoustic wave filter portion 410 is connected to the unbalanced terminal 101, and the other end of the first IDT 413 is connected to the ground potential. One end of a first IDT 433 at the center of the third longitudinally-coupled-resonator-type boundary acoustic wave filter portion 430 is connected to the ground potential and the other end of the IDT 433 is connected to the first balanced terminal 102.

One end of a second IDT 422 included in the second longitudinally-coupled-resonator-type boundary acoustic wave filter portion 420 is electrically connected to one end of a second IDT 442 included in the fourth longitudinally-coupled-resonator-type boundary acoustic wave filter portion 440, and one end of a third IDT 424 included in the second longitudinally-coupled-resonator-type boundary acoustic wave filter portion 420 is electrically connected to one end of a third IDT 444 included in the fourth longitudinally-coupled-resonator-type boundary acoustic wave filter portion 440. The other ends of the IDTs 422, 424, 442, and 444 are connected to the ground potential. One end of a first IDT 423 is connected to the unbalanced terminal 101, and the other end of the first IDT 423 is connected to the ground potential. One end of a first IDT 443 is connected to the ground potential and the other end of the first IDT 443 is connected to the second balanced terminal 103.

The polarity of the IDT 413 is opposite to the polarity of the IDT 423. The second longitudinally-coupled-resonator-type boundary acoustic wave filter portion 420 and the fourth longitudinally-coupled-resonator-type boundary acoustic wave filter portion 440 are substantially the same as the first longitudinally-coupled-resonator-type boundary acoustic wave filter portion 410 and the third longitudinally-coupled-resonator-type boundary acoustic wave filter portion 430, respectively, except that the ends on either side of the second IDT 423 in the direction of propagation of a boundary acoustic wave are series-weighted.

In a portion in which the IDTs 423 and 422 are adjacent to each other and a portion in which the IDTs 423 and 424 are adjacent to each other, the IDT 423 is series-weighted as described previously.

In this exemplary modification, by disposing the metallization ratio reducing portions and/or the metallization ratio increasing portions in the series-weighted portions, the generation of ripples is suppressed.

Figure 17:
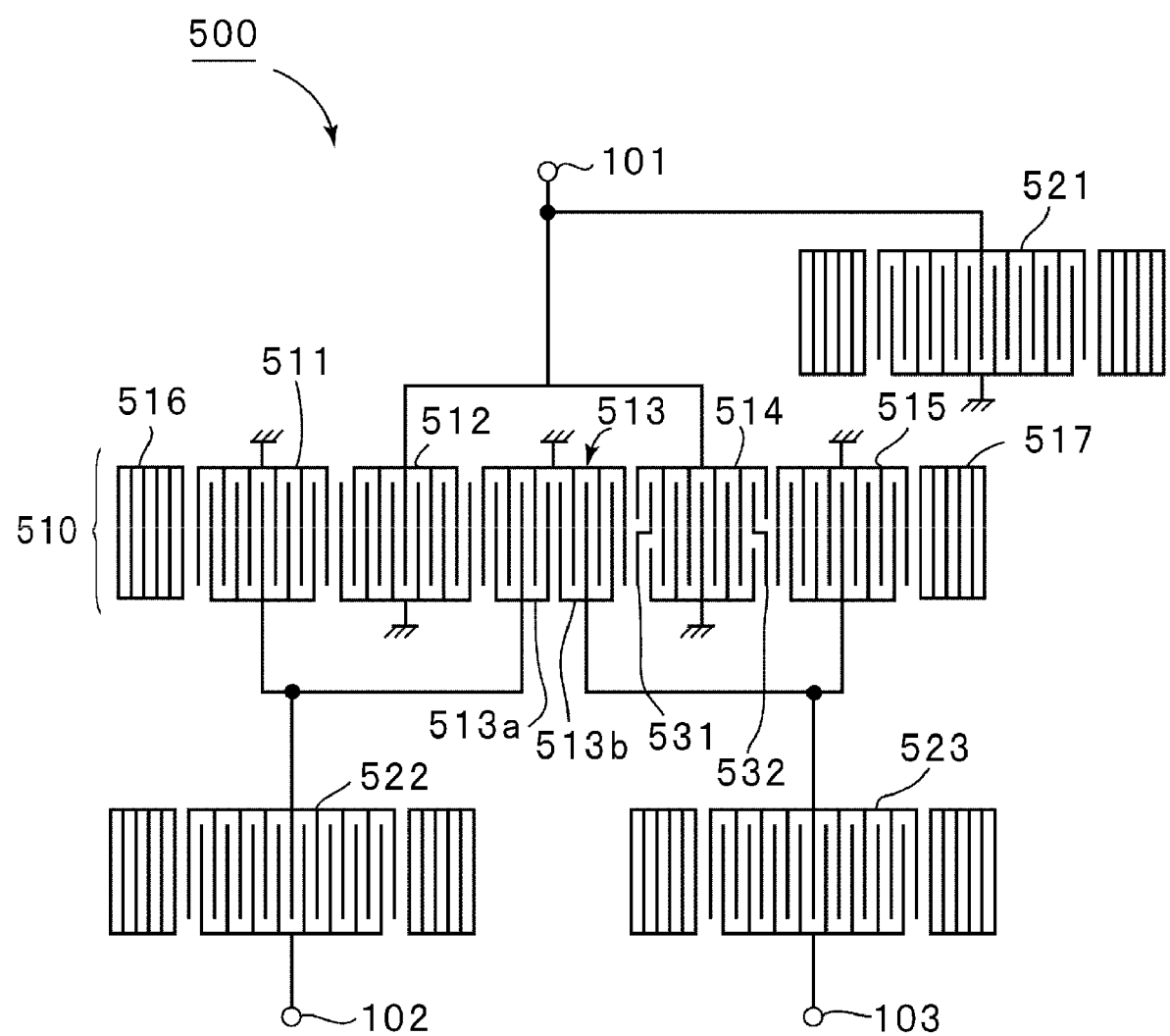
FIG. 17 is a schematic plan view illustrating an electrode configuration of a boundary acoustic wave filter device according to still another exemplary modification of the present invention.
Figure 18:
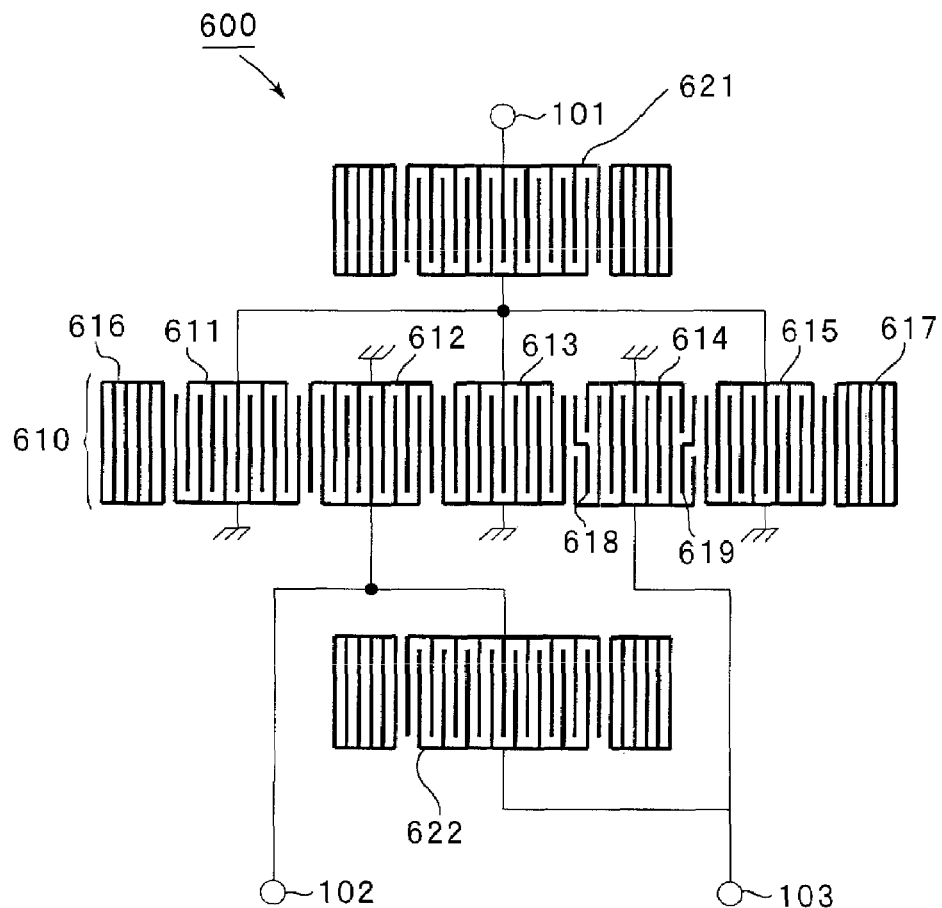
FIG. 18 is a schematic plan view illustrating an electrode configuration of a boundary acoustic wave filter device according to still another exemplary modification of the present invention.
Figure 19:
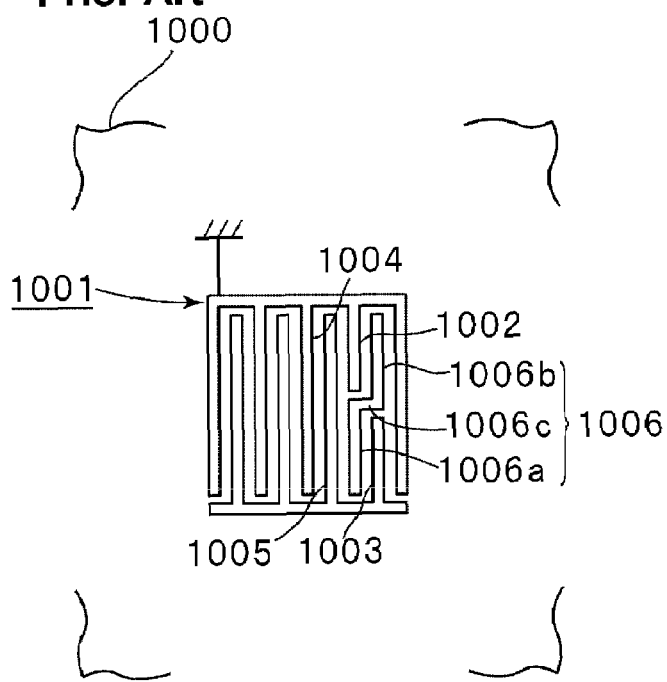
FIG. 19 is a schematic plan view describing an IDT included in a surface acoustic wave filter device in the related art.

FIGS. 17 and 18 are schematic plan views describing other exemplary modifications of the electrode configuration of an elastic wave filter device according to the present invention.

In a boundary acoustic wave filter device 500 illustrated in FIG. 17, the unbalanced terminal 101 is connected to a longitudinally-coupled-resonator-type boundary acoustic wave filter portion 510. In the longitudinally-coupled-resonator-type boundary acoustic wave filter portion 510, a second IDT 512 is disposed on one side of a first IDT 513 disposed at the center, a third IDT 514 is disposed on the other side of the first IDT 513, a fourth IDT 511 is disposed outside the second IDT 512, and a fifth IDT 515 is disposed outside the third IDT 514. That is, the longitudinally-coupled-resonator-type boundary acoustic wave filter portion 510 is a 5-IDT longitudinally-coupled-resonator-type boundary acoustic wave filter.

A reflector 516 is disposed on one side of a region including the IDTs 511 to 515, and a reflector 517 is disposed on the other side of the region.

One end of the second IDT 512 and one end of the third IDT 514 are connected to each other and are then connected to the unbalanced terminal 101. The unbalanced terminal 101 is connected to the ground potential via a boundary acoustic wave resonator 521.

The other ends of the IDTs 512 and 514 are connected to the ground potential. One end of the first IDT 513 at the center is connected to the ground potential, and the other end thereof on the hot side is divided into two sub-IDT portions 513a and 513b. The sub-IDT portion 513a and the other end of the fourth IDT 511 are connected to each other and are then connected to the first balanced terminal 102 via a boundary acoustic wave resonator 522. One end of the fourth IDT 511 is connected to the ground potential. The sub-IDT portion 513b and the other end of the fifth IDT 515 are connected to each other and are then connected to the second balanced terminal 103 via a boundary acoustic wave resonator 523. One end of the IDT 515 is connected to the ground potential.

In this exemplary modification, the polarity of the second IDT 512 is opposite to the polarity of the third IDT 514. Accordingly, the balanced-to-unbalanced conversion function is achieved.

In a portion in which the IDTs 513 and 514 are adjacent to each other, a dummy electrode 531 is disposed in the IDT 514 for series weighting. In a portion in which the IDTs 514 and 515 are adjacent to each other, a dummy electrode 532 is disposed in the IDT 514 for series weighting.

In this exemplary modification, by performing the above-described series weighting, the phase balance and the amplitude balance are improved. Furthermore, similar to the above-described preferred embodiments, by disposing the metallization ratio increasing portions and/or the metallization ratio reducing portions in the series-weighted portions, the generation of ripples in the pass band is suppressed.

In a boundary acoustic wave device 600 according to an exemplary modification illustrated in FIG. 18, similar to the boundary acoustic wave filter device 500, a 5-IDTs-longitudinally-coupled-type resonator boundary acoustic wave filter portion 610 is disposed. One end of a first IDT 613 at the center of the longitudinally-coupled-resonator-type boundary acoustic wave filter portion 610 and one ends of a fourth IDT 611 and a fifth IDT 615, which are the outermost IDTs, are connected to each other and are then connected to the unbalanced terminal 101 via a boundary acoustic wave resonator 621. The other ends of the IDTs 611, 613, and 615 are connected to the ground potential. One end of a second IDT 612 is connected to the ground potential, and the other end thereof is connected to the first balanced terminal 102. One end of a third IDT 614 is connected to the ground potential, and the other end thereof is connected to the second balanced terminal 103. A boundary acoustic wave resonator 622 is connected between the first balanced terminal 102 and the second balanced terminal 103.

The polarity of the second IDT 612 is opposite to the polarity of the third IDT 614. As a result, the balanced-to-unbalanced conversion function is achieved. In a portion in which the third IDT 614 and the first IDT 613 are adjacent to each other, a dummy electrode 618 is disposed in the third IDT 614 for series weighting. In a portion in which the IDTs 614 and 615 are adjacent to each other, a dummy electrode 619 is disposed in the third IDT 614 for series weighting. In this exemplary modification, by disposing the metallization ratio reducing portions and/or the metallization ratio increasing portions in the series-weighted portions, the generation of ripples in the pass band is suppressed.

In the above-described preferred embodiments and the above-described exemplary modifications, the description of a boundary acoustic wave device has been made. However, the present invention can be also applied to a longitudinally-coupled-resonator-type surface acoustic wave filter device using a surface acoustic wave.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A longitudinally-coupled-resonator-type elastic wave filter device comprising:
    a piezoelectric substrate; and
    at least two IDTs disposed on the piezoelectric substrate along a direction of propagation of an elastic wave; wherein
    at least one of the at least two IDTs includes, in a portion in which the at least two IDTs are adjacent to each other, a first electrode finger that is an outermost electrode finger nearest to the other one of the at least two IDTs, a second electrode finger adjacent to the first electrode finger, and a dummy electrode disposed between the first electrode finger and the second electrode finger;
    the dummy electrode includes a first dummy electrode finger portion, a second dummy electrode finger portion, and a connecting portion connecting the first dummy electrode finger portion and the second dummy electrode finger portion, the first dummy electrode finger portion is disposed along an extension line of a longitudinal axis of the first electrode finger with a gap between the first dummy electrode finger portion and a forward end of the first electrode finger and extending substantially in parallel to the second electrode finger, the second dummy electrode finger portion is disposed along an extension line of a longitudinal axis of the second electrode finger with a gap between the second dummy electrode finger portion and a forward end of the second electrode finger and extending substantially in parallel to the first electrode finger, and the connecting portion is disposed between the forward end of the first electrode finger and the forward end of the second electrode finger;
    a length of the first electrode finger and a length of the second electrode finger are different from a length of the other electrode fingers to provide apodization weighting;
    the dummy electrode is disposed to provide series weighting;
    an elastic wave propagation portion in the longitudinally-coupled-resonator-type surface acoustic wave filter device includes a first acoustic track, a second acoustic track disposed on either side of the first acoustic track in a direction substantially perpendicular to the propagation direction of an elastic wave, and a third acoustic track disposed outside the second acoustic track in the direction substantially perpendicular to the propagation direction of the elastic wave, the first acoustic track passing through the connecting portion of the dummy electrode, the second acoustic track including a gap between the forward end of the first electrode finger and the connecting portion of the dummy electrode and a gap between the forward end of the second electrode finger and the connecting portion of the dummy electrode, the third acoustic track including the first electrode finger and the second electrode finger; and
    a series-weighted portion includes at least one of a metallization ratio increasing portion arranged to increase a metallization ratio of the second acoustic track and a metallization ratio reducing portion arranged to reduce a metallization ratio of the first acoustic track so as to reduce a difference between the metallization ratio of the first acoustic track and the metallization ratio of the second acoustic track.

2. The longitudinally-coupled-resonator-type elastic wave filter device according to claim 1, wherein the metallization ratio increasing portion is at least one of a plurality of protrusions in the second acoustic track, the plurality of protrusions including a protrusion protruding from the first dummy electrode finger portion toward the second electrode finger adjacent to the first dummy electrode finger portion, a protrusion protruding from the second dummy electrode finger portion toward the first electrode finger adjacent to the second dummy electrode finger portion, a protrusion protruding from an electrode finger adjacent to the second electrode finger on an inner side of the second electrode finger toward the second electrode finger, a protrusion protruding from the forward end of the first electrode finger toward the second acoustic track, and a protrusion protruding from the forward end of the second electrode finger toward the second acoustic track.

3. The longitudinally-coupled-resonator-type elastic wave filter device according to claim 1, wherein the metallization ratio reducing portion is an electrode cutout portion that is disposed in the connecting portion so as to reduce an area of the connecting portion of the dummy electrode in the first acoustic track.

4. The longitudinally-coupled-resonator-type elastic wave filter device according to claim 1, wherein each of the at least two IDTs is made of a metal film including a metal layer made of a material selected from the group consisting of Au, Pt, Pd, Ag, Cu, W, and an alloy primarily including one of Au, Pt, Pd, Ag, Cu, and W.

5. The longitudinally-coupled-resonator-type elastic wave filter device according to claim 1, further comprising an unbalanced terminal, a first balanced terminal, and a second balanced terminal so as to have a balanced-to-unbalanced conversion function.

6. The longitudinally-coupled-resonator-type elastic wave filter device according to claim 5, wherein
the at least two IDTs on the piezoelectric substrate include a first filter element and a second filter element, the first filter element being a longitudinally-coupled-resonator-type elastic wave filter element including a plurality of IDTs disposed along the propagation direction of an elastic wave, an input terminal, and an output terminal, the second filter element being a longitudinally-coupled-resonator-type filter element including a plurality of IDTs disposed along the propagation direction of an elastic wave, an input terminal, and an output terminal;
an output signal relative to an input signal in the second filter element is about 180° out of phase with an output signal relative to an input signal in the first filter element; and
the input terminals of the first filter element and the second filter element are connected to the unbalanced terminal, the output terminal of the first filter element is connected to the first balanced terminal, and the output terminal of the second filter element is connected to the second balanced terminal.

7. The longitudinally-coupled-resonator-type elastic wave filter device according to claim 6, wherein
the first filter element includes a first longitudinally-coupled-resonator-type elastic wave filter portion and a second longitudinally-coupled-resonator-type elastic wave filter portion each including a plurality of IDTs disposed along a direction of propagation of an elastic wave, the first and second longitudinally-coupled-resonator-type elastic wave filter portions being cascade-connected; and
the second filter element includes a third longitudinally-coupled-resonator-type elastic wave filter portion and a fourth longitudinally-coupled-resonator-type elastic wave filter portion each including a plurality of IDTs disposed along a direction of propagation of an elastic wave, the third and fourth longitudinally-coupled-resonator-type elastic wave filter portions being cascade-connected.

8. The longitudinally-coupled-resonator-type elastic wave filter device according to claim 5, wherein
the longitudinally-coupled-resonator-type elastic wave filter device includes, as the at least two IDTs disposed on the piezoelectric substrate, a fourth IDT, a second IDT, a first IDT, a third IDT, and a fifth IDT disposed in this order along the propagation direction of an elastic wave, and further includes a first reflector disposed on one side of a portion in which the first to fifth IDTs are disposed and a second reflector disposed on the other side of the portion in which the first to fifth IDTs are disposed;
the second IDT is about 180° out of phase with the third IDT;
the second and third IDTs are connected to the unbalanced terminal; and
the first IDT includes a first sub-IDT portion and a second sub-IDT portion which are obtained by dividing the first IDT in the direction of propagation of an elastic wave, the first sub-IDT portion and the fourth IDT being connected to the first balanced terminal, the second sub-IDT portion and the fifth IDT being connected to the second balanced terminal.

9. The longitudinally-coupled-resonator-type elastic wave filter device according to claim 5, wherein
the longitudinally-coupled-resonator-type elastic wave filter device includes, as the at least two IDTs disposed on the piezoelectric substrate, a fourth IDT, a second IDT, a first IDT, a third IDT, and a fifth IDT disposed in this order along the propagation direction of an elastic wave, and further includes a first reflector disposed on one side of the portion in which the first to fifth IDTs are disposed and the second reflector disposed on the other side of the portion in which the first to fifth IDTs are disposed;
the second IDT is about 180° out of phase with the third IDT; and
one end of each of the first, fourth, and fifth IDTs is connected to the unbalanced terminal, the second IDT is connected to the first balanced terminal, and the third IDT is connected to the second balanced terminal.

10. The longitudinally-coupled-resonator-type elastic wave filter device according to claim 1, wherein the elastic wave is a boundary acoustic wave defining a boundary acoustic wave filter device.

11. The longitudinally-coupled-resonator-type elastic wave filter device according to claim 1, further comprising:
a dielectric layer disposed on the piezoelectric substrate; wherein
the elastic wave is a boundary acoustic wave defining a boundary acoustic wave filter device.

* * * * *